US012790678B2

(12) United States Patent
Kim et al.

(10) Patent No.: US 12,790,678 B2
(45) Date of Patent: Nov. 10, 2026

(54) MASK ASSEMBLY, AND APPARATUS AND METHOD OF MANUFACTURING DISPLAY APPARATUS

(71) Applicant: Samsung Display Co., Ltd., Yongin-si (KR)

(72) Inventors: Sanghoon Kim, Yongin-si (KR); Seungjin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 17/106,145

(22) Filed: Nov. 29, 2020

(65) Prior Publication Data

US 2021/0265396 A1 Aug. 26, 2021

(30) Foreign Application Priority Data

Feb. 20, 2020 (KR) ........................ 10-2020-0021143

(51) Int. Cl.

*C23C 14/04* (2006.01)
*H10D 86/01* (2026.01)
*H10K 59/12* (2023.01)

(52) U.S. Cl.

CPC ....... *C23C 14/042* (2013.01); *H10D 86/0231* (2025.01); *H10K 59/12* (2023.02)

(58) Field of Classification Search

CPC ............... H01L 27/1288; H01L 27/326; H01L 51/0011; H01L 27/3216; H01L 27/3218; H01L 27/3244; H01L 27/3234; H01L 21/32; H01L 51/56; C23C 14/042; C23C 16/04; C23C 16/042; H10D 86/0231;

(Continued)

(56) References Cited

U.S. PATENT DOCUMENTS

| | | | |
|---|---|---|---|
| 9,346,078 B2 | 5/2016 | Oh et al. |
| 10,014,471 B2 | 7/2018 | Baek |
| 10,141,511 B2 | 11/2018 | Kim |

(Continued)

FOREIGN PATENT DOCUMENTS

| | | |
|---|---|---|
| CN | 102760842 A | 10/2012 |
| CN | 104846328 A | 8/2015 |

(Continued)

OTHER PUBLICATIONS

Chinese Office Action issued in corresponding Patent Application No. CN 202110193592.3, dated Jan. 29, 2026, 18 pages.

*Primary Examiner* — Dah-Wei D. Yuan
*Assistant Examiner* — Nga Leung V Law
(74) *Attorney, Agent, or Firm* — Womble Bond Dickinson (US) LLP

(57) ABSTRACT

Provided is an apparatus configured to manufacture a display apparatus including a chamber, a mask assembly located inside the chamber to face a display substrate, and a deposition source facing the mask assembly and configured to supply a deposition material to the display substrate, wherein the mask assembly includes a mask frame having an opening portion; and a mask sheet crossing the mask frame, wherein the mask sheet includes a first body part having a first opening portion, a second body part connected to the first body part and having a second opening portion different from the first opening portion, and a third body part connected to the first body part and having a third opening portion.

13 Claims, 21 Drawing Sheets

(58) Field of Classification Search
CPC .... H10K 59/12; H10K 59/121; H10K 71/166; H10K 59/352; H10K 59/353; H10P 14/61
See application file for complete search history.

(56) References Cited

U.S. PATENT DOCUMENTS

| | | | | |
|---|---|---|---|---|
| 10,629,855 | B2 | 4/2020 | Kim et al. | |
| 2012/0266813 | A1 | 10/2012 | Hong | |
| 2017/0179390 | A1 | 6/2017 | Baek | |
| 2017/0263867 | A1* | 9/2017 | Kim | C23C 14/042 |
| 2018/0026189 | A1* | 1/2018 | Kim | C23C 14/12 438/401 |
| 2019/0305222 | A1 | 10/2019 | Jung et al. | |
| 2021/0141304 | A1* | 5/2021 | Liu | G03F 1/38 |
| 2021/0147976 | A1* | 5/2021 | Huang | G06F 1/189 |

FOREIGN PATENT DOCUMENTS

| | | | |
|---|---|---|---|
| CN | 110764362 | A | 2/2020 |
| JP | 2018-109219 | A | 7/2018 |
| KR | 10-2017-0075113 | | 7/2017 |
| KR | 10-2018-0034746 | | 4/2018 |
| KR | 10-2018-0113675 | A | 10/2018 |
| KR | 10-1992261 | | 6/2019 |
| KR | 10-2002494 | | 7/2019 |
| KR | 10-2019-0115129 | | 10/2019 |

* cited by examiner

MASK ASSEMBLY, AND APPARATUS AND METHOD OF MANUFACTURING DISPLAY APPARATUS

CROSS-REFERENCE TO RELATED APPLICATION

This application claims priority from and the benefit of Korean Patent Application No. 10-2020-0021143, filed on Feb. 20, 2020, which is hereby incorporated by reference for all purposes as if fully set forth herein.

BACKGROUND

Field

Exemplary embodiments/implementations of the invention relate generally to an apparatus and method, and more specifically, to a mask assembly, and an apparatus and method of manufacturing a display apparatus, and a method of manufacturing a display apparatus.

Discussion of the Background

Mobile electronic devices have been widely used. Tablet personal computers (PCs) as well as small electronic devices such as mobile phones have recently been widely used as mobile electronic devices.

Mobile electronic devices include display apparatuses for providing visual information such as images to users to support various functions. Recently, as other components configured to drive display apparatuses have been miniaturized, the percentages of the display apparatuses in mobile electronic devices have gradually increased, and structures have been developed to be bendable by certain angles from flat states.

The above information disclosed in this Background section is only for understanding of the background of the inventive concepts, and, therefore, it may contain information that does not constitute prior art.

SUMMARY

Additional aspects will be set forth in part in the description which follows and, in part, will be apparent from the description, or may be learned by practice of the presented embodiments of the disclosure.

Exemplary embodiments provide an apparatus for manufacturing a display apparatus includes a chamber, a mask assembly located inside the chamber to face a display substrate, and a deposition source facing the mask assembly and configured to supply a deposition material to the display substrate, wherein the mask assembly includes a mask frame including an opening portion, and a mask sheet crossing the mask frame, wherein the mask sheet includes a first body part including a first opening portion, a second body part connected to the first body part and including a second opening portion different from the first opening portion, and a third body part connected to the first body part and including a third opening portion.

A shape of the second opening portion and a shape of the third opening portion may be same.

The mask assembly may further include a support frame located in a direction different from a longitudinal direction of the mask sheet and supporting the mask sheet, wherein the third body part overlaps the support frame in a plan view.

The second body part and the third body part may be located opposite to each other with respect to a straight line parallel to a longitudinal direction of the mask sheet and passing through a center of the mask sheet.

A distance from an edge of the second opening portion located at an outermost portion of the second body part to an edge of the mask sheet may be same as a distance from an edge of the third opening portion located at an outermost portion of the third body part to an edge of the mask sheet.

A plurality of second body parts and a plurality of third body parts may be provided, wherein the plurality of second body parts are aligned with one another, and the plurality of third body parts are aligned with one another.

Each second body part and each third body part may be arranged in a serpentine shape.

A sum of areas of second opening portions of the plurality of second body parts and a sum of areas of third opening portions of the plurality of third body parts may be same.

Some and others of the plurality of third body parts may be arranged symmetric to each other with respect to an arbitrary straight line perpendicular to a longitudinal direction of the mask sheet and passing through a center of the mask sheet.

The mask assembly may further include a support frame located in a direction different from a longitudinal direction of the mask sheet and supporting the mask sheet, wherein a plurality of support frames and a plurality of second body parts are provided, wherein a passage area through which the deposition material passes is defined by adjacent support frames from among the plurality of support frames and an edge of the first body part, or by one of the plurality of support frames, the mask frame, and an edge of the first body part, wherein each second body part is located at a corner portion of the passage area.

Exemplary embodiments also provide a method of manufacturing a display apparatus includes locating a display substrate and a mask assembly inside a chamber, and depositing a deposition material on the display substrate through the mask assembly, wherein the mask assembly includes a mask frame including an opening portion, and a mask sheet crossing the mask frame, wherein the mask sheet includes a first body part including a first opening portion, a second body part connected to the first body part and including a second opening portion different from the first opening portion, and a third body part connected to the first body part and including a third opening portion.

A shape of the second opening portion and a shape of the third opening portion may be same.

The mask assembly may further include a support frame located in a direction different from a longitudinal direction of the mask sheet and supporting the mask sheet, wherein the third body part overlaps the support frame in a plan view.

The second body part and the third body part may be located opposite to each other with respect to an arbitrary straight line parallel to a longitudinal direction of the mask sheet and passing through a center of the mask sheet.

A distance from an edge of the second opening portion located at an outermost portion of the second body part to an edge of the mask sheet may be same as a distance from an edge of the third opening portion located at an outermost portion of the third body part to an edge of the mask sheet.

A plurality of second body parts and a plurality of third body parts may be provided, wherein the plurality of second body parts are aligned with one another, and the plurality of third body parts are aligned with one another.

Each second body part and each third body part may be arranged in a serpentine shape.

A sum of areas of second opening portions of the plurality of second body parts and a sum of areas of third opening portions of the plurality of third body parts may be same.

Some and others of the plurality of third body parts may be arranged symmetric to each other with respect to an arbitrary straight line perpendicular to a longitudinal direction of the mask sheet and passing through a center of the mask sheet.

The mask assembly may further include a support frame located in a direction different from a longitudinal direction of the mask sheet and supporting the mask sheet, wherein a plurality of support frames and a plurality of second body parts are provided, wherein a passage area through which the deposition material passes is defined by adjacent support frames from among the plurality of support frames and an edge of the first body part, or by one of the plurality of support frames, the mask frame, and an edge of the first body part, wherein each second body part is located at a corner portion of the passage area.

Exemplary embodiments also provide a mask assembly includes a mask frame including an opening portion, and a mask sheet crossing the mask frame, wherein the mask sheet includes a first body part including a first opening portion, a second body part connected to the first body part and including a second opening portion different from the first opening portion, and a third body part connected to the first body part and including a third opening portion.

A shape of the second opening portion and a shape of the third opening portion may be same.

The mask assembly may further include a support frame located in a direction different from a longitudinal direction of the mask sheet and supporting the mask sheet, wherein the third body part overlaps the support frame in a plan view.

The second body part and the third body part may be located opposite to each other with respect to an arbitrary straight line parallel to a longitudinal direction of the mask sheet and passing through a center of the mask sheet.

A distance from an edge of the second opening portion located at an outermost portion of the second body part to an edge of the mask sheet may be same as a distance from an edge of the third opening portion located at an outermost portion of the third body part to an edge of the mask sheet.

A plurality of second body parts and a plurality of third body parts may be provided, wherein the plurality of second body parts are aligned with one another, and the plurality of third body parts are aligned with one another.

Each second body part and each third body part may be arranged in a serpentine shape.

A sum of areas of second opening portions of the plurality of second body parts and a sum of areas of third opening portions of the plurality of third body parts may be same.

Some and others of the plurality of third body parts may be arranged symmetric to each other with respect to an arbitrary straight line perpendicular to a longitudinal direction of the mask sheet and passing through a center of the mask sheet.

The mask assembly may further include a support frame located in a direction different from a longitudinal direction of the mask sheet and supporting the mask sheet, wherein a plurality of support frames and a plurality of second body parts are provided, wherein a passage area through which the deposition material passes is defined by adjacent support frames from among the plurality of support frames and an edge of the first body part, or by one of the plurality of support frames, the mask frame, and an edge of the first body part, wherein each second body part is located at a corner portion of the passage area.

Other features and advantages of the inventive concepts will become more apparent from the drawings, the claims, and the detailed description.

These general and specific embodiments may be implemented by using a system, a method, a computer program, or a combination thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
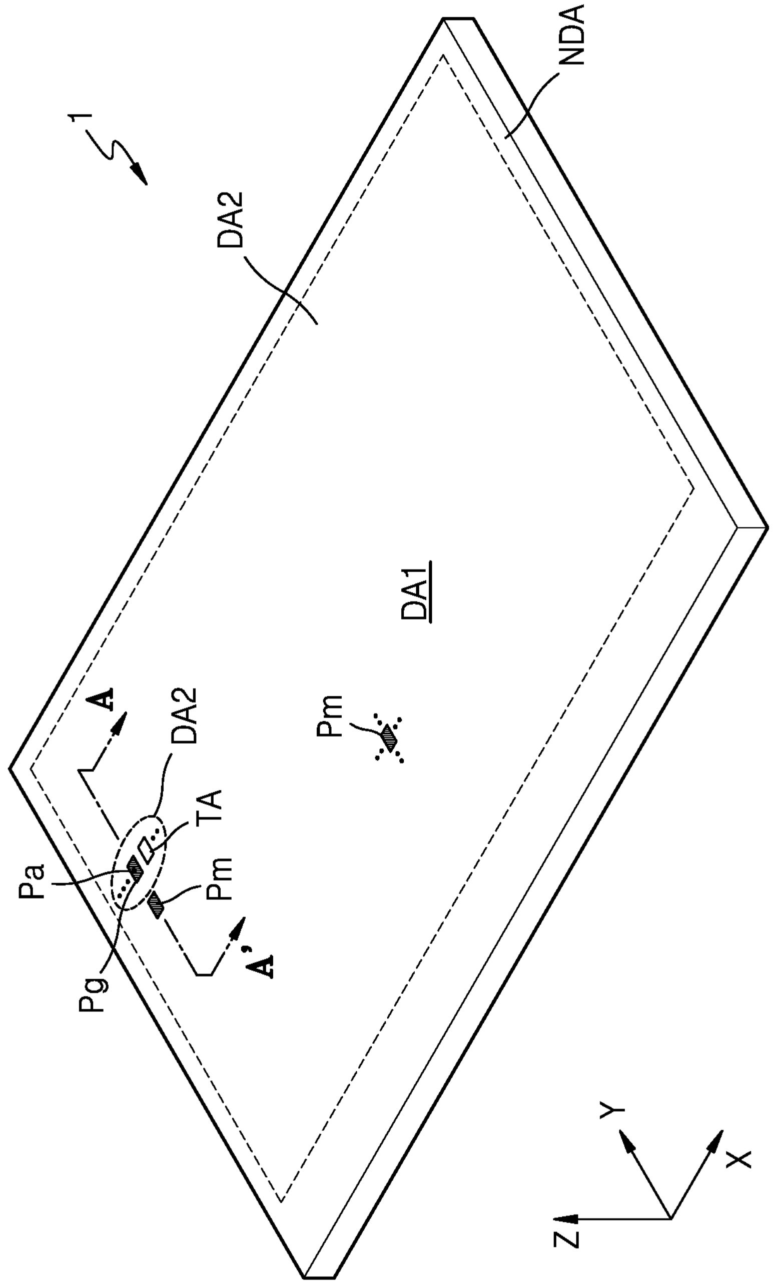
FIG. 1 is a perspective view illustrating a display apparatus according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In general, a mask sheet is elongated and fixed and then used for deposition of a precise pattern in the manufacture of a display apparatus. In this case, a part of the mask sheet may be deformed when the mask sheet is elongated. Because a display apparatus having a non-precise pattern may be manufactured due to the deformation, one or more embodiments of the inventive concepts provide a mask assembly, and an apparatus and method of manufacturing a display apparatus which may manufacture a display apparatus having a precise pattern.

FIG. 1 is a perspective view illustrating a display apparatus according to an embodiment of the inventive concepts.

Referring to FIG. 1, a display apparatus 1 includes a first display area DA1 where an image is formed and a non-display area NDA where an image is not formed. The display apparatus 1 may provide a main image by using light emitted by a plurality of main sub-pixels Pm located in the first display area DA1.

The display apparatus 1 includes a second display area DA2. The second display area DA2 may be an area under which a component such as a sensor using infrared rays, visible light, or sound is located as described below with reference to FIG. 2. The second display area DA2 may include a transmission area TA through which light and/or sound output from the component to the outside or traveling from the outside toward the component may be transmitted. According to an embodiment of the inventive concepts, when light is transmitted through the second display area DA2, a light transmittance may be equal to or greater than about 30%, more preferably equal to or greater than 50%, 75%, 80%, 85%, or 90% through the second display area DA2.

In the present embodiment, the second display area DA2 may include an auxiliary emission area Pg where a plurality of auxiliary sub-pixels Pa are located, and may provide an image by using light emitted by the plurality of auxiliary sub-pixels Pa. An image provided in the second display area DA2 may be an auxiliary image and may have a resolution less than that of an image provided by the first display area DA1. That is, because the second display area DA2 includes the transmission area TA through which light and/or sound may be transmitted, the number of auxiliary sub-pixels Pa that may be located per unit area may be less than the number of main sub-pixels Pm located per unit area in the first display area DA1.

The second display area DA2 may be located on a side of the first display area DA1, but embodiments are not limited thereto. The second display area DA2 may be positioned near any of the sides of the display apparatus DA or towards a center thereof. In an embodiment, the second display area DA2 is located on a left side of the first display area DA1 to be provided between the non-display area NDA and the first display area DA1 in FIG. 1. However, the inventive concepts are not limited thereto. Various modifications may be made. For example, the second display area DA2 may be surrounded by the first display area DA1. Although the second display area DA2 is located on a left side of the first display area DA1 having a quadrangular shape in FIG. 1, the inventive concepts are not limited thereto. A shape of the first display area DA1 may be a circular shape, an elliptical shape, or a polygonal shape such as a triangular shape or a pentagonal shape. As noted, the second display area DA2 may be located on a right side of the first display area DA1. That is, the second display area DA2 may be spaced apart by a certain distance from the center of the first display area DA1.

Although an organic light-emitting display apparatus will be described as the display apparatus 1 according to an embodiment of the inventive concepts, the display apparatus 1 of the inventive concepts is not limited thereto. In another embodiment, the display apparatus 1 of the inventive concepts may be any of various display apparatuses such as an inorganic electroluminescent (EL) display or a quantum dot light-emitting display.

Figure 2:
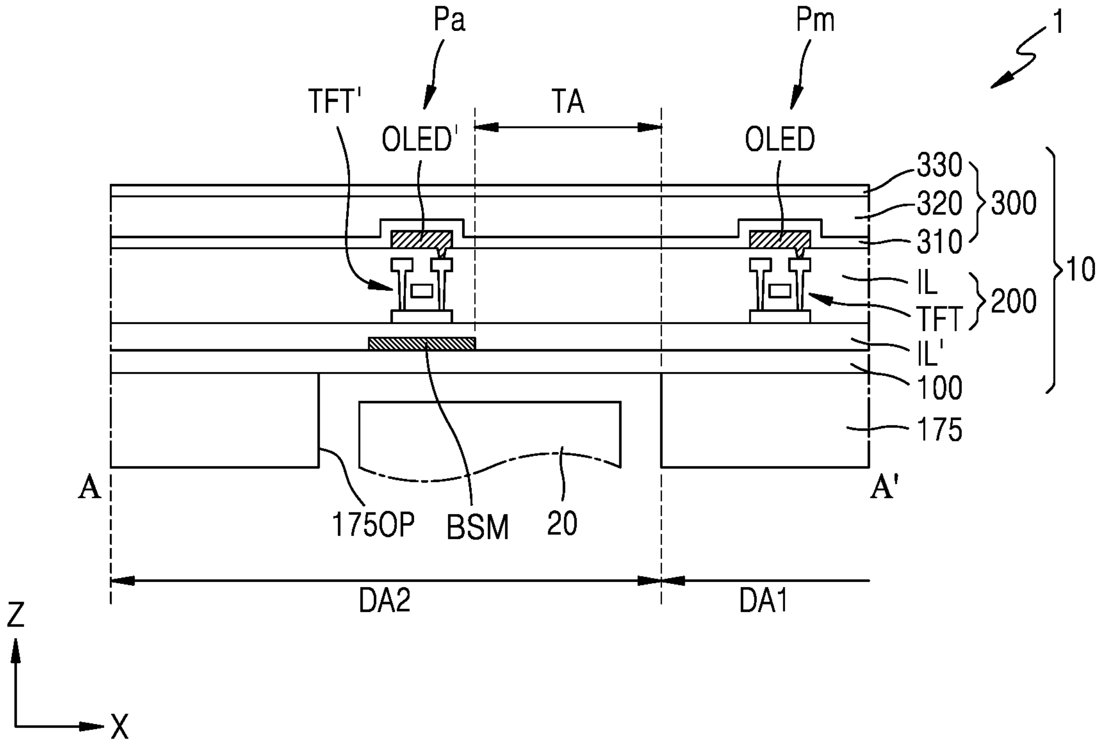
FIG. 2 is a cross-sectional view taken along line A-A' of FIG. 1.

FIG. 2 is a cross-sectional view of a display apparatus according to an embodiment of the inventive concepts, taken along line A-A' of FIG. 1.

Referring to FIG. 2, the display apparatus 1 may include a display panel 10 including a display element and a component 20 corresponding to the second display area DA2.

The display panel 10 may include a substrate 100, a display element layer 200 located on the substrate 100, and a thin-film encapsulation layer 300 that is a sealing member for sealing the display element layer 200. Also, the display panel 10 may further include a lower protective film 175 located under the substrate 100.

The substrate 100 may include glass or a polymer resin. The polymer resin may include polyethersulfone, polyacrylate, polyetherimide, polyethylene naphthalate (PEN), polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the polymer resin and an inorganic layer (not illustrated).

The display element layer 200 may include a circuit layer including first and second thin-film transistors TFT and TFT', organic light-emitting diodes (OLEDs) that are display elements, and insulating layers IL or IL' located between the circuit layer and the OLEDs.

The main sub-pixel Pm including the first thin-film transistor TFT and the OLED connected to the first thin-film transistor TFT may be located in the first display area DA1, and the auxiliary sub-pixel Pa including the second thin-film transistor TFT' and the OLED connected to the second thin-film transistor TFT' may be located in the second display area DA2.

Also, the transmission area TA where a display element is not located may be located in the second display area DA2. The transmission area TA may be an area through which light/a signal emitted from the component 20 or light/a signal incident on the component 20 is transmitted. In this case, the transmission area TA and the auxiliary emission area Pg may be alternately arranged. That is, the transmission area TA may be located between adjacent auxiliary emission areas Pg, and the auxiliary emission area Pg may be located between adjacent transmission areas TA.

The component 20 may be located in the second display area DA2. The component 20 may be an electronic element using light or sound. Examples of the component 20 may include a sensor for receiving and using light such as an infrared sensor, a sensor for outputting and detecting light or sound to measure a distance or recognize a fingerprint or the like, a small lamp for outputting light, a speaker for outputting sound, and a camera. When the component 20 is an electronic element using light, the component 20 may use light of various wavelength bands such as visible light, infrared light, or ultraviolet light. A plurality of components 20 may be provided in the second display area DA2. For example, a light-emitting element and a light-receiving element may be provided together as the component 20 in one second display area DA2. Alternatively, a light emitter and a light receiver may be simultaneously provided in one component 20.

A lower electrode layer BSM may be located in the second display area DA2. The lower electrode layer BSM may be located under the second thin-film transistor TFT' to correspond to the second thin-film transistor TFT'. The lower electrode layer BSM may prevent external light from reaching the auxiliary sub-pixel Pa including the second thin-film transistor TFT'. For example, the lower electrode layer BSM may prevent light emitted from the component 20 from reaching the auxiliary sub-pixel Pa.

In some embodiments, a constant voltage or a signal may be applied to the lower electrode layer BSM, thereby preventing damage to a pixel circuit due to electrostatic discharge.

The thin-film encapsulation layer 300 may include at least one inorganic encapsulation layer and at least one organic encapsulation layer. In this regard, FIG. 2 illustrates first and second inorganic encapsulation layers 310 and 330 and an organic encapsulation layer 320 located between the first and second inorganic encapsulation layers 310 and 330.

Each of the first and second inorganic encapsulation layers 310 and 330 may include at least one inorganic insulating material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene.

The lower protective film 175 may be attached to the bottom of the substrate 100 and may support and protect the substrate 100. The lower protective film 175 may have an opening 175OP corresponding to the second display area DA2. Because the opening 175OP is formed in the lower protective film 175, a light transmittance of the second display area DA2 may be increased. The lower protective film 175 may include polyethylene terephthalate (PET) or polyimide (PI).

The area of the second display area DA2 may be greater than the area of a region where the component 20 is located. Accordingly, the area of the opening 175OP of the lower protective film 175 may not be the same as the area of the second display area DA2. For example, the area of the opening 175OP may be less than the area of the second display area DA2.

Also, the plurality of components 20 may be located in the second display area DA2. The plurality of components 20 may have different functions. For example, one of the plurality of components 20 may be a camera and another one of the plurality of components 20 may be an infrared sensor.

Although not illustrated in FIG. 2, an input sensing member for sensing a touch input, an anti-reflection member including a polarizer, a retarder, a color filter, or a black matrix, and a transparent window may be further located on the display panel 10.

Although the thin-film encapsulation layer 300 is used as a sealing member for sealing the display element layer 200 in the present embodiment, the inventive concepts is not limited thereto. For example, a sealing substrate attached to the substrate 100 by using a sealant or frit may be used as a member for sealing the display element layer 200.

Figure 3:
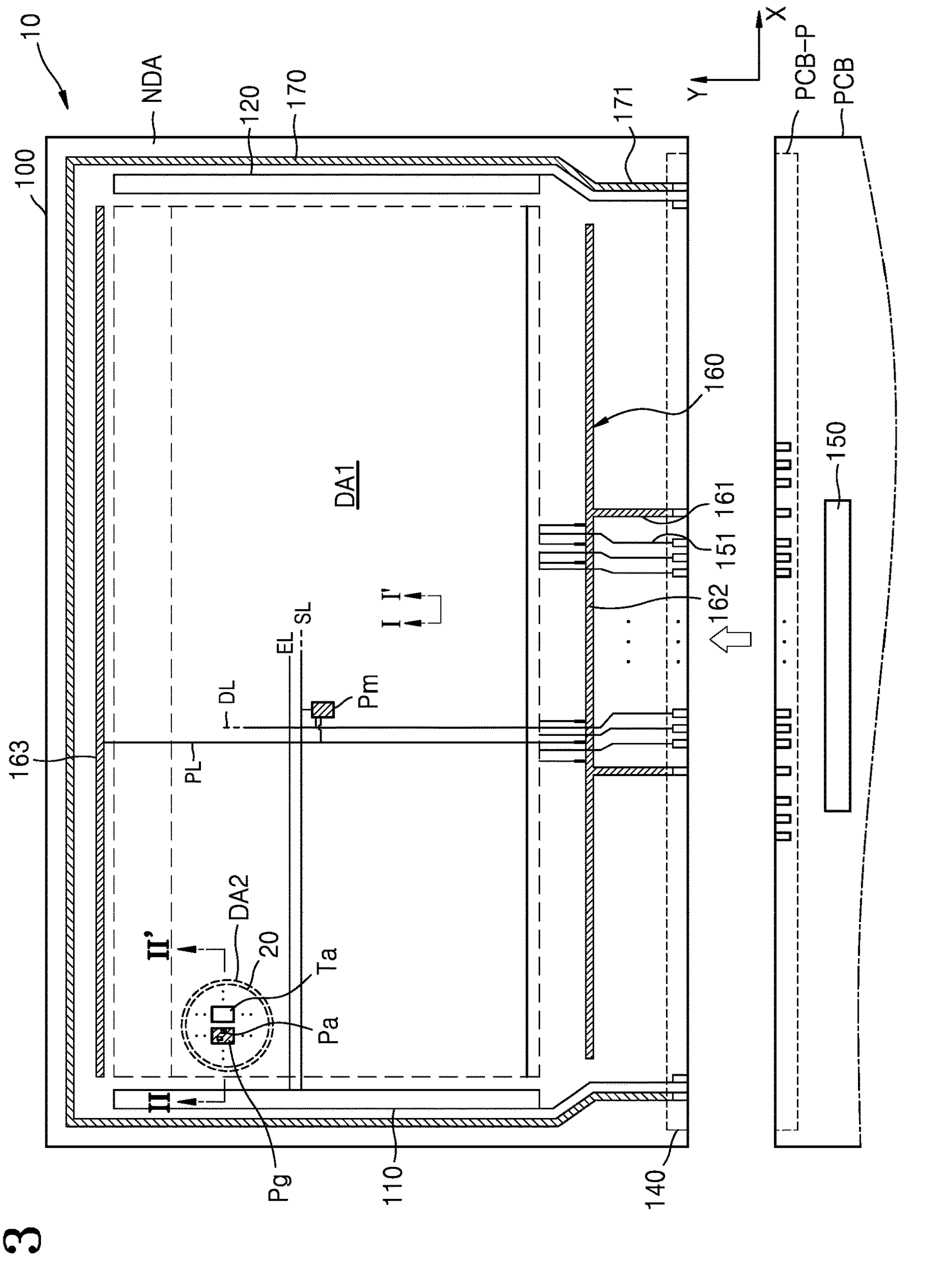
FIG. 3 is a plan view illustrating a display apparatus according to an embodiment of the inventive concepts.

FIG. 3 is a plan view illustrating a display panel according to an embodiment of the inventive concepts.

Referring to FIG. 3, the display panel 10 includes the plurality of main sub-pixels Pm located in the first display area DA1. Each of the main sub-pixels Pm may include a display element such as an OLED. Each main sub-pixel Pm may emit, for example, red, green, blue, or white light, from the OLED. The first display area DA1 may be covered by an encapsulation member described with reference to FIG. 2 to be protected from external air or moisture.

The second display area DA2 may be located on a side of the first display area DA1, and the auxiliary emission area Pg where the plurality of auxiliary sub-pixels Pa are located is located in the second display area DA2. Each of the auxiliary sub-pixels Pa may include a display element such as an OLED. Each auxiliary sub-pixel Pa may emit, for example, red, green, blue, or white light, from the OLED. In this case, two or more auxiliary sub-pixels Pa emitting light of the same color may be located in the auxiliary emission area Pg. The transmission area TA may be located between the auxiliary emission areas Pg in the second display area DA2. At least one component 20 may be located under the second display area DA2 of the display panel 10 to correspond to the second display area DA2.

In an embodiment, one main sub-pixel Pm and one auxiliary sub-pixel Pa may include the same pixel circuit. However, the inventive concepts are not limited thereto. A pixel circuit included in the main sub-pixel Pm and a pixel circuit included in the auxiliary sub-pixel Pa may be different from each other. Because the second display area DA2 includes the transmission area TA, a resolution of the second display area DA2 may be less than that of the first display area DA1.

The main and auxiliary sub-pixels Pm and Pa may be electrically connected to outer circuits located in the non-display area NDA. A first scan driving circuit 110, a second scan driving circuit 120, a terminal 140, a data driving circuit 150, a first power supply wiring 160, and a second power supply wiring 170 may be located in the non-display area NDA.

The first scan driving circuit 110 may apply a scan signal to each of the main and auxiliary sub-pixels Pm and Pa through a scan line SL. The first scan driving circuit 110 may apply an emission control signal to each sub-pixel through an emission control line EL. The second scan driving circuit 120 may be parallel to the first scan driving circuit 110 with the first display area DA1 therebetween. Some of the main and auxiliary sub-pixels Pm and Pa located in the first display area DA1 may be electrically connected to the first scan driving circuit 110, and the others may be connected to the second scan driving circuit 120. In another embodiment, the second scan driving circuit 120 may be omitted.

The terminal 140 may be located at a side of the substrate 100. The terminal 140 may be exposed by not being covered by an insulating layer and may be electrically connected to a printed circuit board (PCB). A terminal PCB-P of the PCB may be electrically connected to the terminal 140 of the display panel 10. The PCB transmits a signal or power of a controller (not illustrated) to the display panel 10. A control signal generated by the controller may be transmitted to each of the first and second scan driving circuits 110 and 120 through the PCB. The controller may supply first power ELVDD and second power ELVSS (see FIGS. 4A and 4B) respectively to the first and second power supply wirings 160 and 170 through first and second connection wirings 161 and 171. The first power ELVDD may be supplied to each of the main and auxiliary sub-pixels Pm and Pa through a driving voltage line PL connected to the first power supply wiring 160, and the second power ELVSS may be supplied to a counter electrode of each of the main and auxiliary sub-pixels Pm and Pa connected to the second power supply wiring 170.

The data driving circuit 150 is electrically connected to a data line DL. A data signal of the data driving circuit 150 may be applied to each of the main and auxiliary sub-pixels Pm and Pa through a connection wiring 151 connected to the terminal 140 and the data line DL connected to the connection wiring 151. Although the data driving circuit 150 is located on the PCB in FIG. 3, in another embodiment, the data driving circuit 150 may be located on the substrate 100. For example, the data driving circuit 150 may be located between the terminal 140 and the first power supply wiring 160.

The first power supply wiring 160 may include a first sub-wiring 162 and a second sub-wiring 163 extending in an X-direction to be parallel to each other with the first display area DA1 therebetween. The second power supply wiring 170 may partially surround the first display area DA1 in a loop shape having one open side.

Figure 4A:
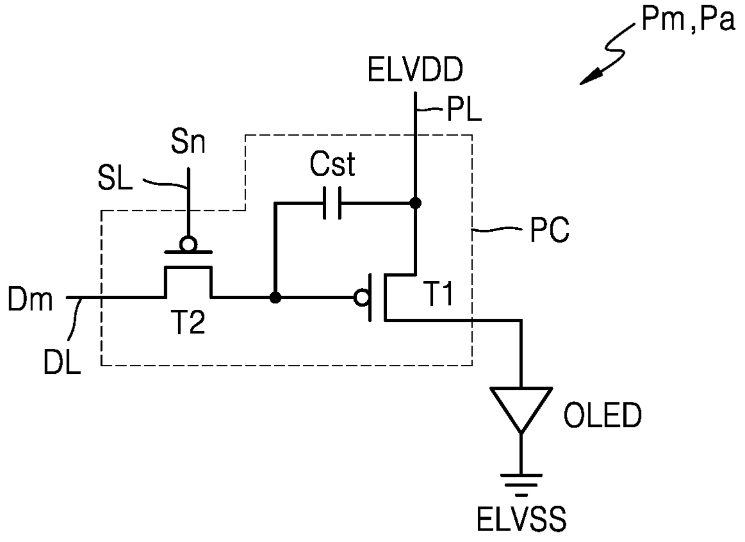
FIG. 4A is an equivalent circuit diagram illustrating a pixel locatable in a display area and/or a sensor area of a display apparatus according to an embodiment of the inventive concepts.

FIG. 4A is an equivalent circuit diagram illustrating a pixel locatable in a display area and/or a sensor area of a display apparatus according to an embodiment of the inventive concepts.

Referring to FIG. 4A, each of the main and auxiliary sub-pixels Pm and Pa includes a pixel circuit PC connected to the scan line SL and the data line DL and an OLED connected to the pixel circuit PC.

The pixel circuit PC includes a driving thin-film transistor (TFT) T1, a switching TFT T2, and a storage capacitor Cst. The switching TFT T2 is connected to the scan line SL and the data line DL, and transmits a data signal Dm input through the data line DL according to a scan signal Sn input through the scan line SL to the driving TFT T1.

The storage capacitor Cst is connected to the switching TFT T2 and the driving voltage line PL, and stores a voltage corresponding to a difference between a voltage received from the switching TFT T2 and the first power ELVDD (or a driving voltage) supplied to the driving voltage line PL.

The driving TFT T1 may be connected to the driving voltage line PL and the storage capacitor Cst and may control driving current flowing through the OLED from the driving voltage line PL in response to the value of a voltage stored in the storage capacitor Cst. The OLED may emit light having a certain luminance according to the driving current.

Figure 4B:
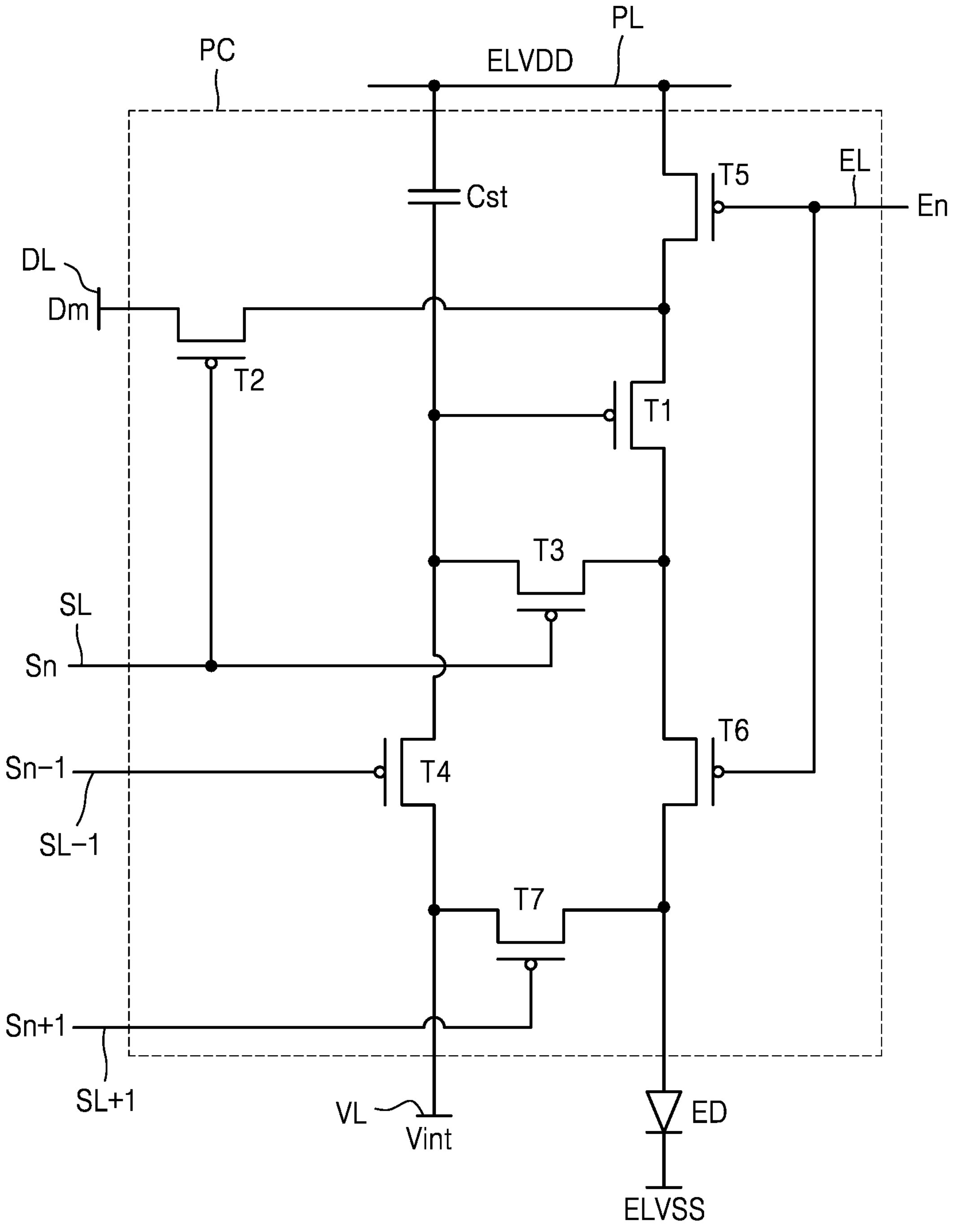
FIG. 4B is an equivalent circuit diagram illustrating a pixel locatable in a display area and/or a sensor area of a display apparatus according to another embodiment of the inventive concepts.

Referring to FIG. 4B, the pixel circuit PC may include the driving TFT T1, the switching TFT T2, a compensation TFT T3, a first initialization TFT T4, an operation control TFT T5, an emission control TFT T6, and a second initialization TFT T7.

Although each pixel circuit PC includes signal lines (e.g., the scan line SL, a previous scan line SL−1, a subsequent scan line SL+1, the emission control line EL, and the data line DL), an initialization voltage line VL, and the driving voltage line PL, the inventive concepts are not limited thereto. In another embodiment, at least one of the signal lines (e.g., the scan line SL, the previous scan line SL−1, the subsequent scan line SL+1, the emission control line EL, and the data line DL), and/or the initialization voltage line VL may be shared by neighboring pixels.

A drain electrode of the driving TFT T1 may be electrically connected to a light-emitting device ED via the emission control TFT T6. The driving TFT T1 receives the data signal Dm according to a switching operation of the switching TFT T2 and supplies driving current to the light-emitting device ED.

A gate electrode of the switching TFT T2 is connected to the scan line SL, and a source electrode of the switching TFT T2 is connected to the data line DL. A drain electrode of the switching TFT T2 may be connected to a source electrode of the driving TFT T1, and may be connected to the driving voltage line PL via the operation control TFT T5.

The switching TFT T2 is turned on according to the scan signal Sn received through the scan line SL, and performs a switching operation of transmitting the data signal Dm through the data line DL to the source electrode of the driving TFT T1.

A gate electrode of the compensation TFT T3 may be connected to the scan line SL. A source electrode of the compensation TFT T3 may be connected to the drain electrode of the driving TFT T1, and may be connected to a pixel electrode of the light-emitting device ED via the emission control TFT T6. A drain electrode of the compensation TFT T3 may be connected to one electrode of the storage capacitor Cst, a source electrode of the first initialization TFT T4, and a gate electrode of the driving TFT T1. The compensation TFT T3 is turned on according to the scan signal Sn received through the scan line SL and diode-connects the driving TFT T1 by connecting the gate electrode to the drain electrode of the driving TFT T1.

A gate electrode of the first initialization TFT T4 may be connected to the previous scan line SL−1. A drain electrode of the first initialization TFT T4 may be connected to the initialization voltage line VL. The source electrode of the first initialization TFT T4 may be connected to one electrode of the storage capacitor Cst, the drain electrode of the compensation TFT T3, and the gate electrode of the driving TFT T1. The first initialization TFT T4 may be turned on according to a previous scan signal Sn−1 received through the previous scan line SL−1 and may perform an initialization operation of initializing a voltage of the gate electrode of the driving TFT T1 by supplying an initialization voltage Vint to the gate electrode of the driving TFT T1.

A gate electrode of the operation control TFT T5 may be connected to the emission control line EL. A source electrode of the operation control TFT T5 may be connected to the driving voltage line PL. A drain electrode of the operation control TFT T5 is connected to the source electrode of the driving TFT T1 and the drain electrode of the switching TFT T2.

A gate electrode of the emission control TFT T6 may be connected to the emission control line EL. A source electrode of the emission control TFT T6 may be connected to the drain electrode of the driving TFT T1 and the source electrode of the compensation TFT T3. A drain electrode of the emission control TFT T6 may be electrically connected to the pixel electrode of the light-emitting device ED. The operation control TFT T5 and the emission control TFT6 are simultaneously turned on according to an emission control signal En received through the emission control line EL, and thus, a driving voltage ELVDD is supplied to the light-emitting device ED and driving current flows through the light-emitting device ED.

A gate electrode of the second initialization TFT T7 may be connected to the subsequent scan line SL+1. A source electrode of the second initialization TFT T7 may be connected to the pixel electrode of the light-emitting device ED. A drain electrode of the second initialization TFT T7 may be connected to the initialization voltage line VL. The second initialization TFT T7 may be turned on according to a subsequent scan signal Sn+1 received through the subsequent scan line SL+1 and may initialize the pixel electrode of the light-emitting device ED.

Although the first initialization TFT T4 and the second initialization TFT T7 are respectively connected to the previous scan line SL−1 and the subsequent scan line SL+1 in FIG. 4B, the inventive concepts is not limited thereto. In another embodiment, the first initialization TFT T4 and the second initialization TFT T7 may be connected to a previous scan line SL−1 and may be driven according to the previous scan signal SL−1.

The other electrode of the storage capacitor Cst may be connected to the driving voltage line PL. Any one electrode of the storage capacitor Cst may be connected to the gate electrode of the driving TFT T1, the drain electrode of the compensation TFT T3, and the source electrode of the first initialization TFT T4.

A counter electrode (e.g., a cathode) of the light-emitting device ED receives a common voltage ELVSS. The light-emitting device ED receives driving current from the driving TFT T1 and emits light.

The number of TFTs and storage capacitors and a circuit design of the pixel circuit PC are not limited to those of FIGS. 4A and 4B, and may be modified in various ways.

The pixel circuits PC driving the main sub-pixel Pm and the auxiliary sub-pixel Pa may be provided in the same manner or different manners. For example, the pixel circuit PC of FIG. 4B may be provided as each of the pixel circuits PC driving the main sub-pixel Pm and the auxiliary sub-pixel Pa. In another embodiment, the pixel circuit PC of FIG. 4B may be used as the pixel circuit PC driving the main sub-pixel Pm, and the pixel circuit PC of FIG. 4A may be used as the pixel circuit PC driving the auxiliary sub-pixel Pa.

Figure 5:
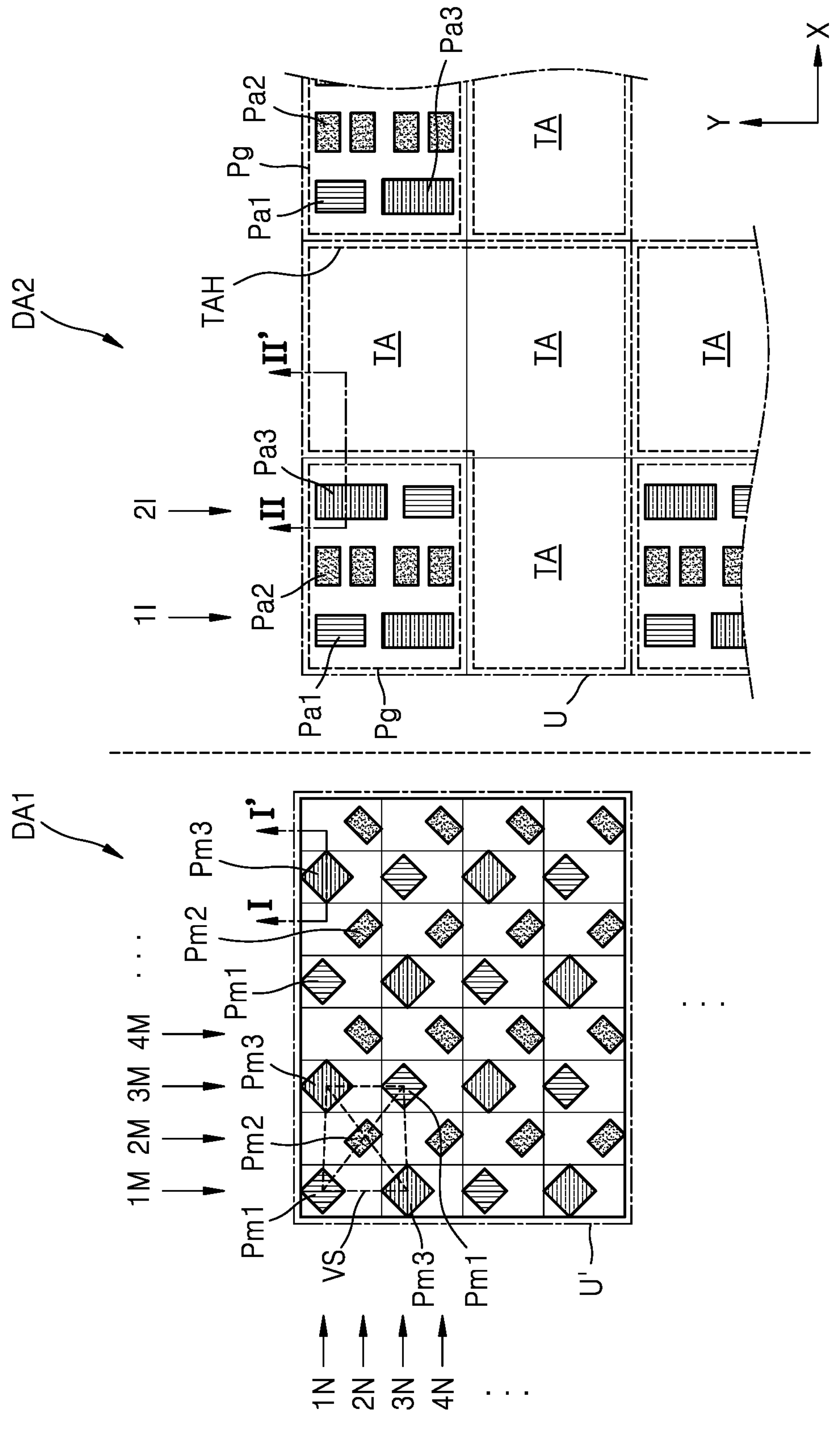
FIG. 5 is a plan view illustrating an arrangement of a transmission area and sub-pixels located in a first display area and a second display area.

FIG. 5 is a plan view illustrating an arrangement of a transmission area and sub-pixels located in a first display area and a second display area.

Referring to FIG. 5, first through third main sub-pixels Pm1, Pm2, and Pm3 are located in the first display area DA1 and the auxiliary emission area Pg including first through third auxiliary sub-pixels Pa1, Pa2, and Pa3 and the transmission area TA are located in the second display area DA2 of a display apparatus according to an embodiment of the inventive concepts.

In the present embodiment, the first through third main sub-pixels Pm1, Pm2, and Pm3 located in the first display area DA1 and the first through third auxiliary sub-pixels Pa1, Pa2, and Pa3 located in the second display area DA2 may have different pixel arrangement structures. A pixel arrangement structure used herein will be described based on an emission area of each sub-pixel. In this case, the emission area of each sub-pixel may be defined by an opening of a pixel-defining film, which will be described below.

As illustrated in FIG. 5, the first through third main sub-pixels Pm1, Pm2, and Pm3 located in the first display area DA1 may be arranged in a pentile structure. The first main sub-pixel Pm1, the second main sub-pixel Pm2, and the third main sub-pixel Pm3 may represent different colors. For example, the first main sub-pixel Pm1, the second main sub-pixel Pm2, and the third main sub-pixel Pm3 may respectively represent red, green, and blue colors.

A plurality of first main sub-pixels Pm1 and a plurality of third main sub-pixels Pm3 are alternately arranged in a first row 1N, a plurality of second main sub-pixels Pm2 are arranged at certain intervals in a second row 2N adjacent to the first row 1N, the third main sub-pixel Pm3 and the first main sub-pixel Pm1 are alternately arranged in a third row 3N adjacent to the second row 2N, a plurality of second main sub-pixels Pm2 are arranged at certain intervals in a fourth row 4N adjacent to the third row 3N, and such a pixel arrangement is repeated to an $N^{th}$ row. In this case, the third main sub-pixel Pm3 and the first main sub-pixel Pm1 may be larger than the second main sub-pixel Pm2.

The plurality of first main sub-pixels Pm1 and third main sub-pixels Pm3 located in the first row 1N and the plurality of second main sub-pixels Pm2 located in the second row 2N are alternately arranged. Accordingly, the first main sub-pixel Pm1 and the third main sub-pixel Pm3 are alternately arranged in a first column 1M, a plurality of second main sub-pixels Pm2 are arranged at certain intervals in a second column 2M adjacent to the first column 1M, the third main sub-pixel Pm3 and the first main sub-pixel Pm1 are alternately arranged in a third column 3M adjacent to the second column 2M, a plurality of second main sub-pixels Pm2 are arranged at certain intervals in a fourth column 4M adjacent to the third column 3M, and such a pixel arrangement is repeated to an $M^{th}$ column.

In other words, from among vertices of a virtual quadrangular shape VS having a center point of the second main sub-pixel Pm2 as a center point of the virtual quadrangular shape VS, the first main sub-pixels Pm1 may be located at first and third vertices that face each other, and the third main sub-pixels Pm3 may be located at second and fourth vertices that are the remaining vertices. In this case, the virtual quadrangular shape VS may be modified to many various shapes such as a rectangular shape, a diamond shape, or a square shape.

Such a pixel arrangement structure may be referred to as a pentile matrix structure, and a rendering driving method that represents a color by sharing adjacent pixels may be used, thereby displaying an image having a high resolution with a small number of pixels.

The first through third auxiliary sub-pixels Pa1, Pa2, and Pa3 located in the second display area DA2 may have shapes different from those of the first through third main sub-pixels Pm1, Pm2, and Pm3 and may be located in a structure different from that of the first through third main sub-pixels Pm1, Pm2, and Pm3. The first auxiliary sub-pixel Pa1, the second auxiliary sub-pixel Pa2, and the third auxiliary sub-pixel Pa3 may represent different colors. For example, the first auxiliary sub-pixel Pa1, the second auxiliary sub-pixel Pa2, and the third auxiliary sub-pixel Pa3 may respectively represent red, green, and blue colors.

The first auxiliary sub-pixel Pa1 and the third auxiliary sub-pixels Pa3 may be sequentially aligned in a first column 1I, and the third auxiliary sub-pixel Pa3 and the first auxiliary sub-pixel Pa1 may be sequentially aligned in a second column 2I adjacent to the first column 1I. In this case, the first auxiliary sub-pixels Pa1 and the third auxiliary sub-pixels Pa3 in the first column 1I and the second column 2I may be arranged opposite to each other.

A plurality of second auxiliary sub-pixels Pa2 may be located between the first auxiliary sub-pixel Pa1 and the third auxiliary sub-pixel Pa3 that are adjacent to each other. The plurality of second auxiliary sub-pixels Pa2 may be arranged at certain intervals. In particular, the plurality of second auxiliary sub-pixels Pa2 may be aligned in a Y-direction to be spaced apart from one another.

The first auxiliary sub-pixels Pa1, the second auxiliary sub-pixels Pa2, and the third auxiliary sub-pixels Pa3 may constitute one auxiliary emission area Pg. Although eight first through third auxiliary sub-pixels Pa1, Pa2, and Pa3 are included in one auxiliary emission area Pg in FIG. 5, an embodiment of the inventive concepts is not limited thereto and the number and an arrangement of the first through third auxiliary sub-pixels Pa1, Pa2, and Pa3 included in one auxiliary emission area Pg may be modified in various ways.

A plurality of transmission areas TA where a display element is not located and a light transmittance is high may be provided in the second display area DA2. The transmission areas TA and the auxiliary emission areas Pg may be alternately arranged in a first direction (e.g., the X-direction) and/or a second direction (e.g., the Y-direction). Alternatively, the transmission areas TA may surround the auxiliary emission areas Pg.

In the second display area DA2, a basic unit U in which the auxiliary emission area Pg and the transmission areas TA are grouped may be repeatedly located in the X-direction and the Y-direction.

In FIG. 5, the basic unit U may have a quadrangular shape in which one auxiliary emission area Pg and the transmission areas TA around the one auxiliary emission area Pg are grouped. The basic unit U is a repeating shape and does not mean separation of elements. For example, the transmission areas TA included in one basic unit U may be integrally formed with the transmission areas TA included in another adjacent basic unit U.

In some embodiments, in the basic unit U, an area occupied by the auxiliary emission area Pg may be less than an area occupied by the transmission areas TA. For example, an area occupied by the auxiliary emission area Pg may be about ⅓ of that of the transmission areas TA. In other words, an area occupied by the auxiliary emission area Pg may be about ¼ of that of the basic unit U, and an area occupied by the transmission areas TA may be about ¾ of that of the basic unit U.

A corresponding unit U' having the same area as the area of the basic unit U may be configured in the first display area DA1. In this case, the number of first through third main sub-pixels Pm1, Pm2, and Pm3 included in the corresponding unit U' may be greater than the number of first through third auxiliary sub-pixels Pa1, Pa2, and Pa3 included in the basic unit U.

Figure 6:
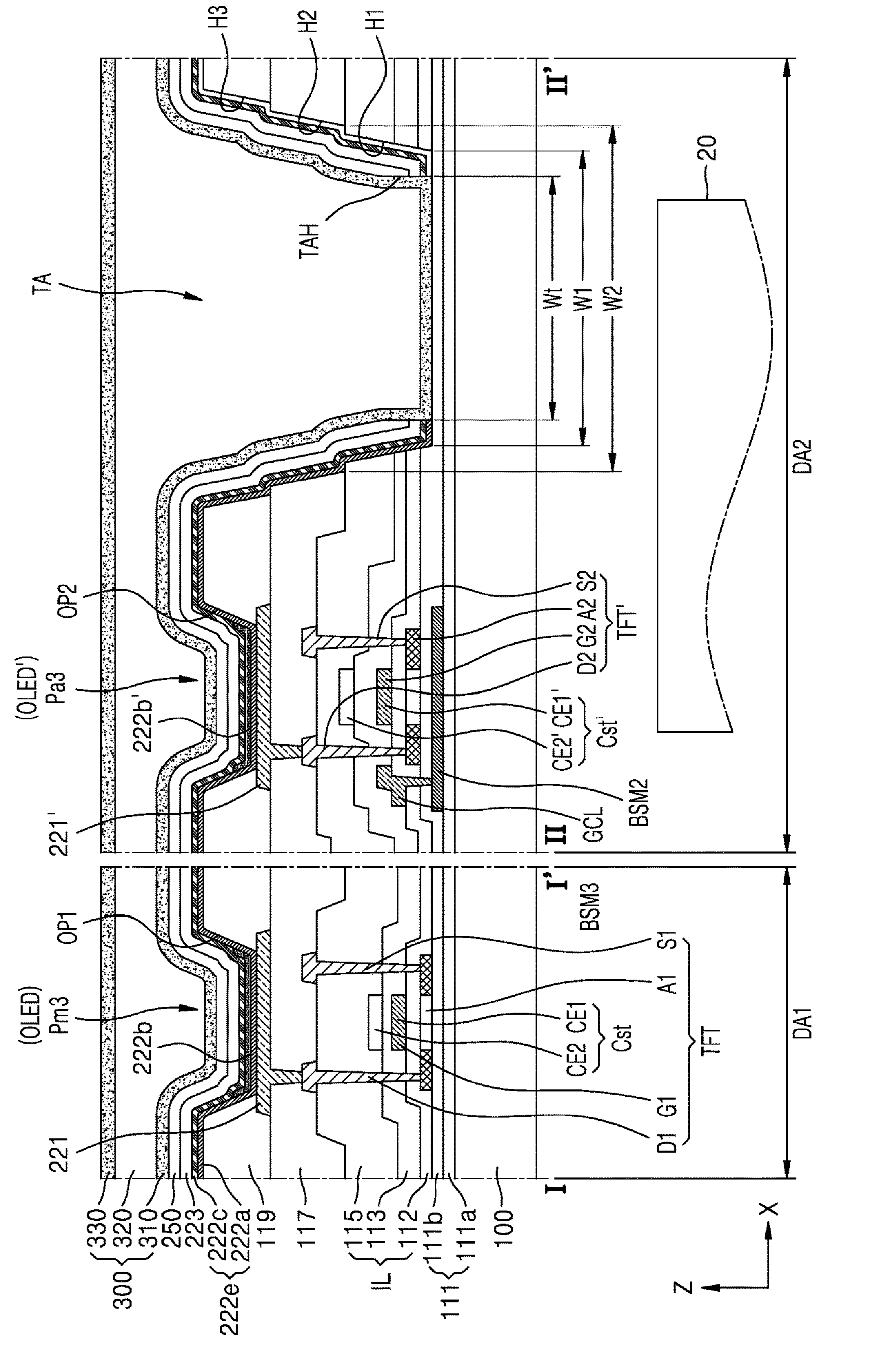
FIG. 6 is a cross-sectional view taken along lines I-I' and II-II' of FIG. 5.

FIG. 6 is a cross-sectional view taken along lines I-I' and II-II' of FIG. 5.

Referring to FIG. 6, the third main sub-pixel Pm3 is located in the first display area DA1, and the third auxiliary sub-pixel Pa3 and the transmission area TA are located in the second display area DA2. In this case, the third main sub-pixel Pm3 and the third auxiliary sub-pixel Pa3 may be sub-pixels for representing the same color. In some embodiments, the third main sub-pixel Pm3 and the third auxiliary sub-pixel Pa3 may represent a blue color.

Each main sub-pixel Pm may include a first thin-film transistor TFT, a main storage capacitor Cst, and a main organic light-emitting diode OLED. Each auxiliary sub-pixel Pa may include a second thin-film transistor TFT', an auxiliary storage capacitor Cst', and an auxiliary organic light-emitting diode OLED'. The transmission area TA may have an opening portion TAH corresponding to the transmission area TA.

The component 20 may be located under the second display area DA2. The component 20 may be a camera for capturing an image or an infrared (IR) sensor for transmitting/receiving infrared rays.

Because the transmission area TA is located in the second display area DA2, light transmitted/received to/from the component 20 may be transmitted through the transmission area TA. For example, light emitted by the component 20 may travel in a Z-direction through the transmission area TA, and light generated outside a display apparatus and incident on the component 20 may travel in a −Z-direction through the transmission area TA. In some embodiments, the component 20 may include a plurality of image sensors, and one image sensor may be located to correspond to one transmission area TA.

A structure in which elements included in the display apparatus are stacked according to an embodiment of the inventive concepts will be described.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 including the polymer resin may be flexible, rollable, or bendable. The substrate 100 may have a multi-layer structure including a layer including the polymer resin and an inorganic layer (not illustrated).

A buffer layer 111 may be located on the substrate 100, and may reduce or prevent penetration of a foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single or multi-layer structure including an inorganic material and an organic material. A barrier layer (not illustrated) for preventing penetration of external air may be further provided between the substrate 100 and the buffer layer 111. In some embodiments, the buffer layer 111 may include silicon oxide ($SiO_2$) or silicon nitride ($SiN_x$). A first buffer layer 111*a* and a second buffer layer 111*b* of the buffer layer 111 may be stacked.

The lower electrode layer BSM may be located between the first buffer layer 111*a* and the second buffer layer 111*b*, in the second display area DA2. In another embodiment, the lower electrode layer BSM may be located between the substrate 100 and the first buffer layer 111*a*. The lower electrode layer BSM may be located under the second thin-film transistor TFT', to prevent characteristics of the second thin-film transistor TFT' from being degraded due to light emitted from the component 20, etc.

Also, the lower electrode layer BSM may be connected through a contact hole to a wiring GCL located on another layer. The lower electrode layer BSM may receive a constant voltage or a signal from the wiring GCL. For example, the lower electrode layer BSM may receive a driving voltage ELVDD or a scan signal. As the lower electrode layer BSM receives a constant voltage or a signal, the risk of electrostatic discharge may be significantly reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The lower electrode layer BSM may have a single or multi-layer structure formed of the above material.

The first thin-film transistor TFT and the second thin-film transistor TFT' may be located on the buffer layer 111. The first thin-film transistor TFT includes a first semiconductor layer A1, a first gate electrode G1, a first source electrode S1, and a first drain electrode D1, and the second thin-film transistor TFT' includes a second semiconductor layer A2, a second gate electrode G2, a second source electrode S2, and a second drain electrode D2. The first thin-film transistor TFT may be connected to the main organic light-emitting diode OLED of the first display area DA1 and may drive the main organic light-emitting diode OLED. The second thin-film transistor TFT' may be connected to an auxiliary organic light-emitting diode OLED' of the second display area DA2 and may drive the auxiliary organic light-emitting diode OLED'.

The first semiconductor layer A1 and the second semiconductor layer A2 may be located on the buffer layer 111, and may each include polysilicon. In another embodiment, each of the first semiconductor layer A1 and the second semiconductor layer A2 may include amorphous silicon. In another embodiment, each of the first semiconductor layer A1 and the second semiconductor layer A2 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). Each of the first semiconductor layer A1 and the second semiconductor layer A2 may include a channel region, and a source region and a drain region doped with impurities.

The first semiconductor layer A1 may overlap the lower electrode layer BSM with the second buffer layer 111*b* therebetween. In an embodiment, a width of the first semiconductor layer A1 may be less than a width of the lower electrode layer BSM, and thus, the first semiconductor layer A1 may overlap the lower electrode layer BSM in a direction perpendicular to the substrate 100.

A first gate insulating layer 112 may be provided to cover the first semiconductor layer A1 and the second semiconductor layer A2. The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may have a single or multi-layer structure including the above inorganic insulating material.

The first gate electrode G1 and the second gate electrode G2 are located on the first gate insulating layer 112 to respectively overlap the first semiconductor layer A1 and the second semiconductor layer A2. Each of the first gate electrode G1 and the second gate electrode G2 may have a single or multi-layer structure including molybdenum (Mo), aluminum (Al), copper (Cu), or titanium (Ti). For example, each of the first gate electrode G1 and the second gate electrode G2 may have a single-layer structure including Mo.

A second gate insulating layer 113 may be provided to cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may have a single or multi-layer structure including the above inorganic insulating material.

A first upper electrode CE2 of a main storage capacitor Cst and a second upper electrode CE2' of an auxiliary storage capacitor Cst' may be located on the second gate insulating layer 113.

The first upper electrode CE2 may overlap the first gate electrode G1 located under the first upper electrode CE2, in the first display area DA1. The first gate electrode G1 and the first upper electrode CE2 overlapping each other with the second gate insulating layer 113 therebetween may constitute the main storage capacitor Cst. The first gate electrode G1 may be a first lower electrode CE1 of the main storage capacitor Cst.

The second upper electrode CE2' may overlap the second gate electrode G2 located under the second upper electrode CE2', in the second display area DA2. The second gate electrode G2 and the second upper electrode CE2' overlapping each other with the second gate insulating layer 113 therebetween may constitute the auxiliary storage capacitor Cst'. The first gate electrode G1 may be a second lower electrode CE1' of the auxiliary storage capacitor Cst'.

Each of the first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single or multi-layer structure including the above material.

An interlayer insulating layer 115 may be formed to cover the first upper electrode CE2 and the second upper electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

When the first gate insulating layer 112, the second gate insulating layer 113, and the interlayer insulating layer 115 are collectively referred to as an inorganic insulating layer IL, a stacked structure of the inorganic insulating layer IL on the substrate 100 may have a transmittance of about 90% or more for an infrared wavelength. For example, light having a wavelength ranging from about 900 nm to about 1100 nm passing through the substrate 100 and the inorganic insulating layer IL may have a transmittance of about 90%.

The first and second source electrodes S1 and S2 and the first and second drain electrodes D1 and D2 are located on the interlayer insulating layer 115. Each of the first and second source electrodes S1 and S2 and the first and second drain electrodes D1 and D2 may include a conductive material including molybdenum (Mo), aluminum (Al), copper (Cu), or titanium (Ti), and may have a single or multi-layer structure including the conductive material. For example, each of the first and second source electrodes S1 and S2 and the first and second drain electrodes D1 and D2 may have a multi-layer structure including Ti/Al/Ti.

A planarization layer 117 may be located to cover the first and second source electrodes S1 and S2 and the first and second drain electrodes D1 and D2. The planarization layer 117 may have a flat top surface so that a main pixel electrode 221 and an auxiliary pixel electrode 221' located over the planarization layer 117 are flat.

The planarization layer 117 may have a single or multi-layer structure formed of an organic material. The planarization layer 117 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

An opening portion through which any one of the first source electrode S1 and the first drain electrode D1 of the first thin-film transistor TFT is exposed may be formed in the planarization layer 117, and the main pixel electrode 221 may contact the first source electrode S1 or the first drain electrode D1 through the opening portion and may be electrically connected to the first thin-film transistor TFT.

Also, an opening portion through which any one of the second source electrode S2 and the second drain electrode D2 of the second thin-film transistor TFT' is exposed may be formed in the planarization layer 117, and the auxiliary pixel electrode 221' may contact the second source electrode S2 or the second drain electrode D2 through the opening portion and may be electrically connected to the second thin-film transistor TFT'.

Each of the main pixel electrode 221 and the auxiliary pixel electrode 221' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, each of the main pixel electrode 221 and the auxiliary pixel electrode 221' may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, each of the main pixel electrode 221 and the auxiliary pixel electrode 221' may further include a film formed of ITO, IZO, ZnO, or $In_2O_3$ over/under the reflective film. In some embodiments, each of the main pixel electrode 221 and the auxiliary pixel electrode 221' may have a stacked structure including ITO/Ag/ITO.

A pixel-defining film 119 may cover an edge of each of the main pixel electrode 221 and the auxiliary pixel electrode 221'. The pixel-defining film 119 overlaps each of the main pixel electrode 221 and the auxiliary pixel electrode 221' and has a first opening OP1 and a second opening OP2 defining an emission area of a sub-pixel. The pixel-defining film 119 may prevent an arc or the like from occurring on the edge of each of the main and auxiliary pixel electrodes 221 and 221' by increasing a distance between the edge of each of the main and auxiliary pixel electrodes 221 and 221' and a counter electrode 223 located over the main and auxiliary pixel electrodes 221 and 221'. The pixel-defining film 119 may be formed of an organic insulating material such as polyimide, polyamide, acrylic resin, benzocyclobutene, hexamethyldisiloxane (HMDSO), or phenolic resin by using spin coating or the like.

When the planarization layer 117 and the pixel-defining film 119 are referred to as an organic insulating layer OL, the organic insulating layer OL may have a transmittance of about 90% or more for an infrared wavelength. For example, light having a wavelength from about 900 nm to about 1100 nm passing through the organic insulating layer OL may have a transmittance of about 90%.

A main intermediate layer (not illustrated) and an auxiliary intermediate layer (not illustrated) may be located in the first opening OP1 and the second opening OP2 of the pixel-defining film 119 to respectively correspond to the main pixel electrode 221 and the auxiliary pixel electrode 221'. In this case, the main intermediate layer includes a main emission layer **222*b*, and the auxiliary intermediate layer includes an auxiliary emission layer 222*b*'. Each of the main emission layer 222*b* and the auxiliary emission layer 222*b*'** may include a high molecular weight material or a low molecular weight material, and may emit red, green, blue, or white light.

The main intermediate layer and/or the auxiliary intermediate layer may include an organic functional layer **222*e* located over and/or under the main emission layer 222*b* and the auxiliary emission layer 222*b*'. The organic functional layer 222*e* may include a first functional layer 222*a* and/or a second functional layer 222*c*. The first functional layer 222*a* or the second functional layer 222*c*** may be omitted.

The first functional layer **222*a* may be located under the main emission layer 222*b* and the auxiliary emission layer 222*b*'. In this case, in an embodiment, the first functional layer 222*a* may be patterned to correspond to the first opening OP1 and the second opening OP2, like the main emission layer 222*b* and the auxiliary emission layer 222*b*', and may be located in the first opening OP1 and the second opening OP2. In another embodiment, the first functional layer 222*a* may be located to entirely cover the first display area DA1 and the second display area DA2. In another embodiment, the first functional layer 222*a* may be patterned to correspond to the first opening OP1 and the second opening OP2, and may be located in the first opening OP1 and the second opening OP2 and may not be located in the transmission area TA. In another embodiment, the first functional layer 222*a* may be located to entirely shield the first display area DA1 and a portion of the second display area DA2 other than the transmission area TA. For convenience of explanation, the following will be described assuming that the first functional layer 222*a*** is located to entirely cover the first display area DA1 and the second display area DA2.

The first functional layer **222*a* may have a single or multi-layer structure formed of an organic material. The first functional layer 222*a* may be a hole transport layer (HTL) having a single-layer structure. Alternatively, the first functional layer 222*a* may include a hole injection layer (HIL) and a hole transport layer (HTL). The first functional layer 222*a* may be integrally formed to correspond to the main sub-pixels Pm and the auxiliary sub-pixels Pa included in the first display area DA1 and the second display area DA2. Accordingly, the first functional layer 222*a*** may be located to correspond to the transmission area TA.

The second functional layer **222*c* may be located over the main emission layer 222*b* and the auxiliary emission layer 222*b*'. In this case, in an embodiment, the first functional layer 222*c* may be patterned to correspond to the first opening OP1 and the second opening OP2, like the main emission layer 222*b* and the auxiliary emission layer 222*b*', and may be located in the first opening OP1 and the second opening OP2. In another embodiment, the second functional layer 222*c* may be located to entirely cover the first display area DA1 and the second display area DA2. In another embodiment, the second functional layer 222c may be patterned to correspond to the first opening OP1 and the second opening OP2, and may be located in the first opening OP1 and the second opening OP2 and may not be located in the transmission area TA. In another embodiment, the second functional layer 222c may be located to entirely shield the first display area DA1 and a portion of the second display area DA2 other than the transmission area TA. For convenience of explanation, the following will be described assuming that the second functional layer 222c is located to entirely cover the first display area DA1 and the second display area DA2**.

The second functional layer 222c may have a single or multi-layer structure formed of an organic material. The second functional layer 222c may include an electron transport layer (ETL) and/or an electron injection layer (EIL). The second functional layer 222c may be integrally formed to correspond to the main sub-pixels Pm and the auxiliary sub-pixels Pa included in the first display area DA1 and the second display area DA2. Accordingly, the second functional layer 222c may be located to correspond to the transmission area TA.

The counter electrode 223 is located over the second functional layer 222c. The counter electrode 223 may include a conductive material having a low work function. For example, the counter electrode 223 may include a semi-transparent layer including silver (Ag), magnesium (Mg), aluminum (Al) platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 223 may further include a layer formed of ITO, IZO, ZnO, or $In_2O_3$ on the semi-transparent layer including the above material. The counter electrode 223 may be integrally formed to correspond to the main sub-pixels Pm and the auxiliary sub-pixels Pa included in the first display area DA1 and the second display area DA2.

Layers from the main pixel electrode 221 to the counter electrode 223 formed in the first display area DA1 may constitute the main organic light-emitting diode OLED. Layers from the auxiliary pixel electrode 221' to the counter electrode 223 formed in the second display area DA2 may constitute the auxiliary organic light-emitting diode OLED'.

An upper layer 250 including an organic material may be formed on the counter electrode 223. The upper layer 250 may be a layer for protecting the counter electrode 223 and improving light extraction efficiency. The upper layer 250 may include an organic material having a refractive index higher than that of the counter electrode 223. Alternatively, the upper layer 250 may be provided by stacking layers having different refractive indexes. For example, the upper layer 250 may be provided by stacking a high-refractive-index layer, a low-refractive-index layer, and a high-refractive-index layer. In this case, a refractive index of the high-refractive-index layer may be equal to or greater than 1.7, and a refractive index of the low-refractive-index layer may be equal to or less than 1.3.

The upper layer 250 may additionally include LiF. Alternatively, the upper layer 250 may additionally include an inorganic insulating material such as silicon oxide ($SiO_2$) or silicon nitride ($SiN_x$).

In the present embodiment, the first functional layer 222a, the second functional layer 222c, the counter electrode 223, and the upper layer 250 may include the opening portion TAH corresponding to the transmission area TA. That is, the first functional layer 222a, the second functional layer 222c, the counter electrode 223, and the upper layer 250 may have openings respectively corresponding to the transmission area TA. The openings of the first functional layer 222a, the second functional layer 222c, the counter electrode 223, and the upper layer 250 may be formed by using a laser. In some embodiments, widths of the openings constituting the opening portion TAH may be substantially the same. For example, a width of the opening of the counter electrode 223 may be substantially the same as a width of the opening portion TAH.

Also, in the present embodiment, the first functional layer 222a, the second functional layer 222c, and the upper layer 250 may be omitted. In this case, the opening of the counter electrode 223 may become the opening portion TAH.

When the opening portion TAH corresponds to the transmission area TA, it may mean that the opening portion TAH overlaps the transmission area TA. In this case, the area of the opening portion TAH may be less than the area of a first hole H1 formed in the inorganic insulating layer IL. To this end, in FIG. 6, a width Wt of the opening portion TAH is less than a width W1 of the first hole H1. The area of the opening portion TAH and the area of the first hole H1 may be defined as the area of a narrowest opening.

In some embodiments, the first functional layer 222a, the second functional layer 222c, the counter electrode 223, and the upper layer 250 may be located at side surfaces of the first hole H1, a second hole H2, and a third hole H3. In some embodiments, gradients of the side surfaces of the first hole H1, the second hole H2, and the third hole H3 with respect to a top surface of the substrate 100 may be gentler than a gradient of a side surface of the opening portion TAH with respect to the top surface of the substrate 100.

When the opening portion TAH is formed, it means that a member such as the counter electrode 222 is removed from the transmission area TA, and thus, a light transmittance of the transmission area TA may be significantly increased.

The main organic light-emitting diode OLED and the auxiliary organic light-emitting diode OLED' may be sealed by a thin-film encapsulation layer 300. The thin-film encapsulation layer 300 may be located on the upper layer 250. The thin-film encapsulation layer 300 may prevent penetration of external moisture or a foreign material into the main organic light-emitting diode OLED and the auxiliary organic light-emitting diode OLED'.

The thin-film encapsulation layer 300 may include at least one inorganic encapsulation layer and at least one organic encapsulation layer, and in this regard, in FIG. 6, the thin-film encapsulation layer 300 includes a first inorganic encapsulation layer 310, an organic encapsulation layer 320, and a second inorganic encapsulation layer 330 that are stacked. In another embodiment, the number of organic encapsulation layers, the number of inorganic encapsulation layers, and an order in which organic encapsulation layers and inorganic encapsulation layers are stacked may be modified.

Each of the first and second inorganic encapsulation layers 310 and 330 may include at least one inorganic insulating material such as aluminum oxide, titanium oxide, tantalum oxide, hafnium oxide, zinc oxide, silicon oxide, silicon nitride, and silicon oxynitride, and may be formed by using chemical vapor deposition (CVD) or the like. The organic encapsulation layer 320 may include a polymer-based material. The polymer-based material may include a silicone resin, an acrylic resin, an epoxy resin, polyimide, and polyethylene.

The first inorganic encapsulation layer 310, the organic encapsulation layer 320, and the second inorganic encapsulation layer 330 may be integrally formed to cover a display area DA and a sensor area SA. Accordingly, the first inorganic encapsulation layer 310, the organic encapsulation layer 320, and the second inorganic encapsulation layer 330 may be located in the opening portion TAH.

In another embodiment, the organic encapsulation layer 320 may be integrally formed to cover the second display area DA2, and may not be located in the transmission area TA. In other words, the organic encapsulation layer 320 may have an opening corresponding to the transmission area TA. In this case, the first inorganic encapsulation layer 310 and the second inorganic encapsulation layer 330 may contact each other in the opening portion TAH.

Figure 7:
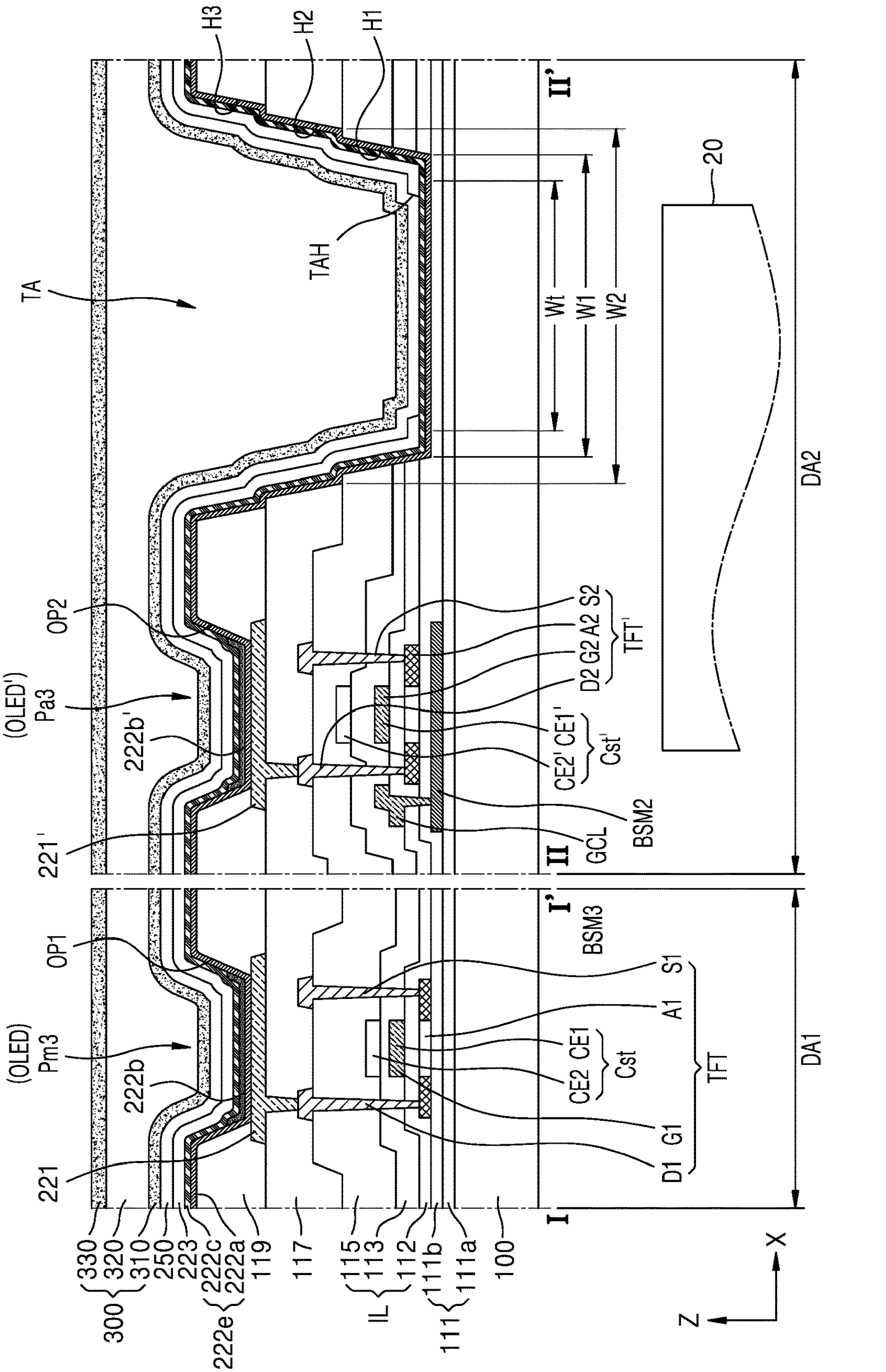
FIG. 7 is a cross-sectional view illustrating a display apparatus according to another embodiment of the inventive concepts.

FIG. 7 is a cross-sectional view illustrating a display apparatus according to an embodiment of the inventive concepts. In FIG. 7, the same members as those of FIG. 6 are denoted by the same reference numerals, and thus a repeated explanation thereof will be omitted.

Referring to FIG. 7, a display apparatus may include the first display area DA1 where the main sub-pixel Pm is located, and the second display area DA2 where an auxiliary emission area (not illustrated) including the auxiliary sub-pixel Pa and the transmission area TA are located. Also, in the display apparatus according to the present embodiment, a pixel arrangement structure of the main sub-pixels Pm is different from a pixel arrangement structure of the auxiliary sub-pixels Pa.

In the present embodiment, at least one of the first functional layer 222*a*, the second functional layer 222*c*, and the upper layer 250 may be located to correspond to the transmission area TA. That is, at least one of the first functional layer 222*a*, the second functional layer 222*c*, and the upper layer 250 may be located in the opening portion TAH.

The counter electrode 223 may have an opening corresponding to the transmission area TA, and a width of the opening may be substantially the same as a width of the opening portion TAH. In this case, the counter electrode 223 may be formed by using a mask including a covering portion that covers the transmission area TA.

In another embodiment, after the counter electrode 223 is entirely formed, an opening may be formed in the counter electrode 223 by removing a portion of the counter electrode 223 corresponding to the transmission area TA by using a laser.

Figure 8:
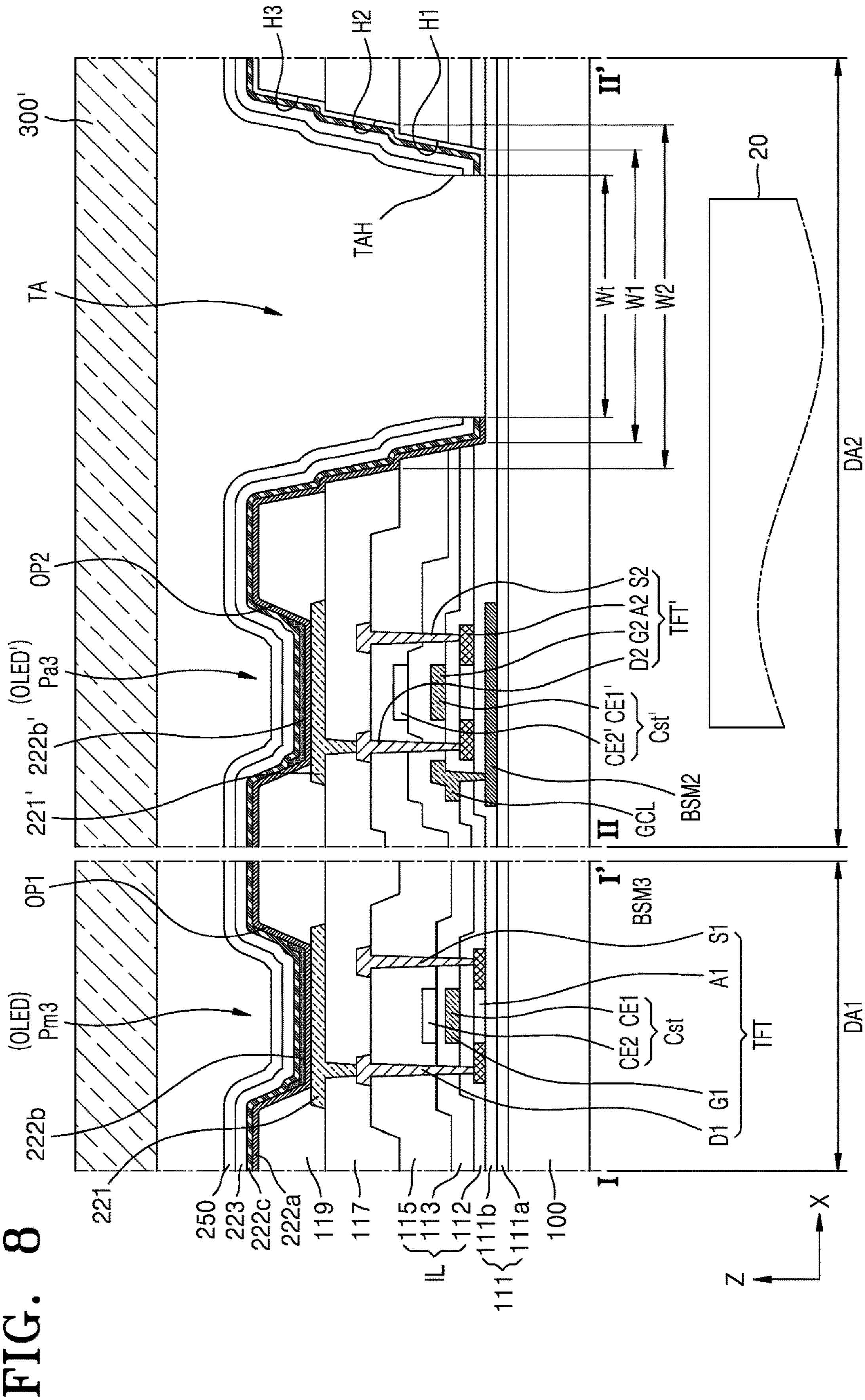
FIG. 8 is a cross-sectional view illustrating a display apparatus according to yet another embodiment of the inventive concepts.

FIG. 8 is a cross-sectional view illustrating a display apparatus according to an embodiment of the inventive concepts. In FIG. 8, the same members as those of FIG. 6 are denoted by the same reference numerals, and thus a repeated explanation thereof will be omitted.

Referring to FIG. 8, a display apparatus may include the first display area DA1 where the main sub-pixel Pm is located, and the second display area DA2 where the auxiliary sub-pixel Pa and the transmission area TA are located. Also, in the display apparatus according to the present embodiment, a pixel arrangement structure of the main sub-pixels Pm is different from a pixel arrangement structure of the auxiliary sub-pixels Pa.

In the present embodiment, the main organic light-emitting diode OLED and the auxiliary organic light-emitting diode OLED' may be covered by an encapsulation substrate 300'. The encapsulation substrate 300' includes a transparent material. For example, the encapsulation substrate 300' may include a glass material. Alternatively, the encapsulation substrate 300' may include a polymer resin. The encapsulation substrate 300' may prevent penetration of external moisture or a foreign material into the main organic light-emitting diode OLED and the auxiliary organic light-emitting diode OLED'.

A sealing material such as a sealant may be located between the encapsulation substrate 300' and the substrate 100 on which the main organic light-emitting diode OLED and the auxiliary organic light-emitting diode OLED' are formed. The sealing material may prevent penetration of external moisture or a foreign material between the substrate 100 and the encapsulation substrate 300'.

Figure 9:
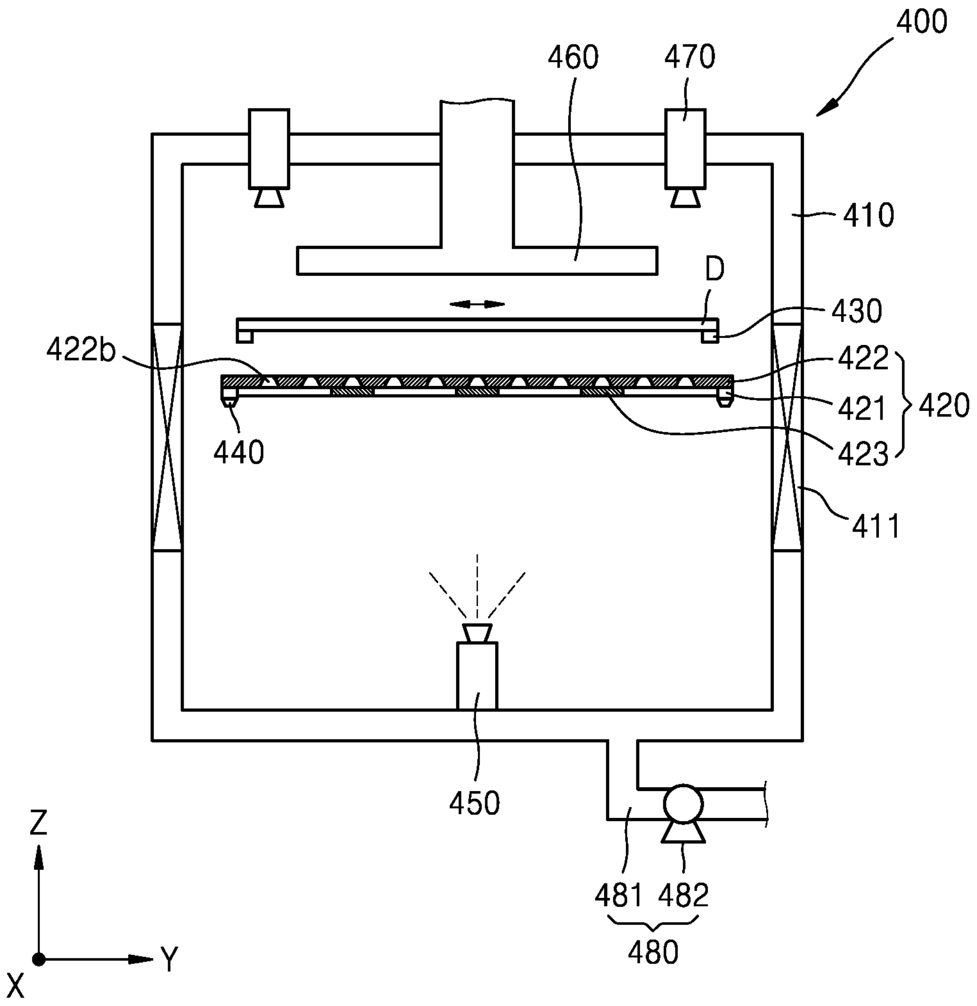
FIG. 9 is a cross-sectional view illustrating an apparatus for manufacturing a display apparatus according to an embodiment of the inventive concepts.
Figure 10:
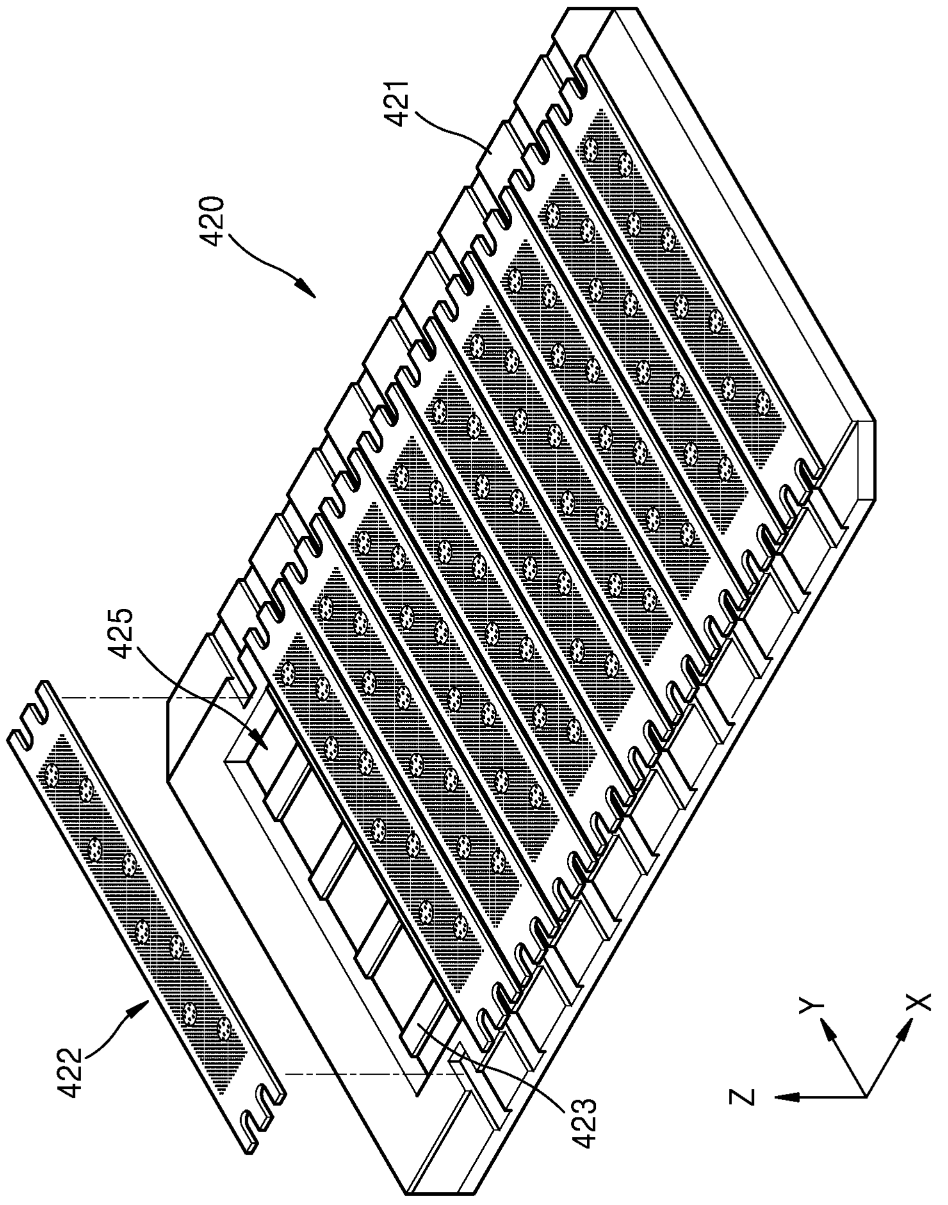
FIG. 10 is a perspective view illustrating a mask assembly of FIG. 9.
Figure 11:
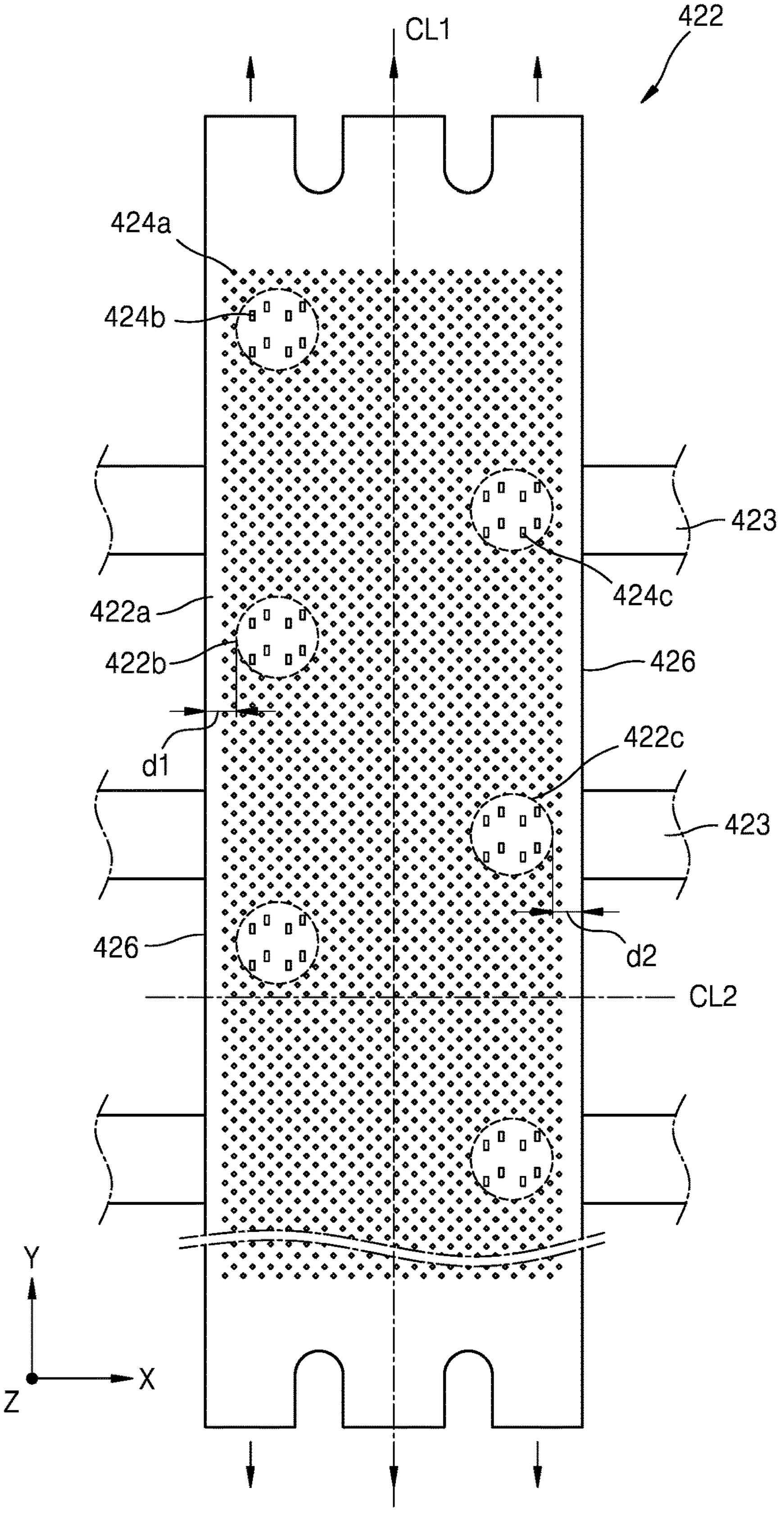
FIG. 11 is a plan view illustrating a mask sheet of FIG. 10.

FIG. 9 is a cross-sectional view illustrating an apparatus for manufacturing a display apparatus according to an embodiment of the inventive concepts. FIG. 10 is a perspective view illustrating a mask assembly of FIG. 9. FIG. 11 is a plan view illustrating a mask sheet of FIG. 10.

Referring to FIGS. 9 through 11, a display apparatus (not illustrated) may be manufactured by an apparatus 400 for manufacturing a display apparatus.

The apparatus 400 may include a chamber 410, a mask assembly 420, a first support 430, a second support 440, a deposition source 450, a magnetic force generator 460, a vision unit 470, and a pressure regulator 480.

The chamber 410 may have an inner space, and the chamber 410 may be formed so that a portion of the chamber 410 is open. In this case, a gate valve 411 may be located in the open portion of the chamber 410 to be opened/closed.

The mask assembly 420 may be selectively located inside the chamber 410. In this case, the mask assembly 420 may include a mask frame 421, a mask sheet 422, and a support frame 423.

The mask frame 421 may be formed by connecting a plurality of frames, and may include an opening portion 425 formed inside the mask frame 421. In this case, the mask frame 421 may include one opening portion 425, or a plurality of opening portions 425 that are separated from one another. In this case, the mask frame 421 may be formed in a lattice shape such as a window frame shape. For convenience of explanation, the following will be described assuming that the mask frame 421 includes one opening portion 425 formed at the center.

The mask sheet 422 may be elongated and may be fixed to the mask frame 421. In this case, the mask sheet 422 may include an opening portion 425 through which a deposition material is configured to pass. One or more mask sheets 422 may be provided. When one mask sheet 422 is provided, the mask sheet 422 may be located on the mask frame 421 and may shield the opening portion of the mask frame 421. In another embodiment, when a plurality of mask sheets 422 are provided, the plurality of mask sheets 422 may be located adjacent to one another along a side of the mask frame 421 and may shield the opening portion of the mask frame 421. For convenience of explanation, the following will be described assuming that a plurality of mask sheets 422 are provided.

The mask sheet 422 may include a first body part 422*a* including main sub-pixel opening portions 424*a*, a second body part 422*b* including auxiliary sub-pixel opening portions 424*b*, and a third body part 422*c* including correction opening portions 424*c*. The auxiliary sub-pixel opening portions 424*b* and correction opening portions 424*c* may be larger than the main sub-pixel opening portions 424*a*.

The second body part 422*b* may have many various shapes. A shape of the second body part 422*b* may correspond to that of a second display area (not illustrated). For example, when the second display area has a circular shape, the second body part 422*b* may have a circular shape. In another embodiment, when the second display area has a polygonal shape, the second body part 422*b* may have a polygonal shape. For convenience of explanation, the following will be described assuming that the second display area and the second body part 422*b* have circular shapes.

The second body part 422*b* may be located close to a side surface of the mask sheet 422 in a plan view. For example, the second body part 422*b* may be located at a corner portion of a passage area defined, as an area through which a deposition material passes, by an edge 426 of the mask sheet 422 and the support frame 423 that are adjacent to each other. In this case, the passage area may be defined by the mask frame 421, the edge 426 of the mask sheet 422, and the support frame 423 at an end of the mask sheet 422.

The second body part 422*b* and the third body part 422*c* may be defined by the main sub-pixel opening portions 424*a*. For example, a shape of each of the second body part 422*b* and the third body part 422*c* may be defined by connecting vertices of the main sub-pixel opening portions 424*a* surrounding an edge of each of the second body part 422*b* and the third body part 422*c*. In another embodiment, when an edge of a component overlaps the mask sheet 422, each of the second body part 422*b* and the third body part 422*c* may be defined as a portion overlapping the edge of the component. In this case, the second body part 422*b* may be defined by connecting arbitrary lines passing through spaces between the main sub-pixel opening portions 424*a* and the auxiliary sub-pixel opening portions 424*b* that are adjacent to each other. Also, the third body part 422*c* may be defined by connecting arbitrary lines passing through spaces between the main sub-pixel opening portions 424*a* and the correction opening portions 424*c* that are adjacent to each other. In this case, the arbitrary lines may have the same shape as that of the edge of the component. For convenience of explanation, the following will be described assuming that each of the second body part 422*b* and the third body part 422*c* is defined by using the component.

Shapes of each main sub-pixel opening portion 424*a* and each auxiliary sub-pixel opening portion 424*b* may be different from each other. Also, shapes of each main sub-pixel opening portion 424*a* and each correction opening portion 424*c* may be different from each other. In this case, shapes and sizes of the auxiliary sub-pixel opening portion 424*b* and the correction opening portion 424*c* may be the same. For example, a planar shape of the main sub-pixel opening portion 424*a* may be a diamond shape, and planar shapes of the auxiliary sub-pixel opening portion 424*b* and the correction opening portion 424*c* may be rectangular shapes or square shapes.

The second body part 422*b* and the third body part 422*c* may be located opposite to each other with respect to a first center line CL1 passing through a longitudinal direction (e.g., a Y-direction of FIG. 11) of the first body part 422*a*. Also, the second body part 422*b* and the third body part 422*c* may not be on an arbitrary straight line parallel to a direction (e.g., an X-direction of FIG. 11) perpendicular to the longitudinal direction of the first body part 422*a*. In this case, the second body part 422*b* and the third body part 422*c* may be alternately arranged. In particular, when a plurality of second body parts 422*b* and a plurality of third body parts 422*c* are provided, the second body parts 422*b* and the third body parts 422*c* may be arranged in a zigzag shape or a serpentine shape.

The second body part 422*b* and the third body part 422*c* may be located at different distances from one end of the mask sheet 422 in the longitudinal direction of the mask sheet 422. For example, assuming that one end of the mask sheet 422 is the upper side in FIG. 11, a distance from the second body part 422*b* to the end of the mask sheet 422 may be less than a distance from the third body part 422*c* to the end of the mask sheet 422. In another embodiment, although not illustrated in FIG. 11, a distance from the second body part 422*b* to an end of the mask sheet 422 may be greater than a distance from the third body part 422*c* to the end of the mask sheet 422.

A plurality of second body parts 422*b* may be provided, and the plurality of second body parts 422*b* may be aligned to be spaced apart from one another in the longitudinal direction of the mask sheet 422. Also, a plurality of third body parts 422*c* may be provided, and the plurality of third body parts 422*c* may be aligned to be spaced apart from one another in the longitudinal direction of the mask sheet 422.

The second body part 422*b* and the third body part 422*c* may be located at the same distance from edges 426 (or the boundary of a side surface) of the mask sheet 422. For example, a first distance d1 from an edge of the auxiliary sub-pixel opening portion 424*b* located at an outermost portion of the second body part 422*b* to the edge 426 of the mask sheet 422 and a second distance d2 from an edge of the correction opening portion 424*c* located at an outermost portion of the third body part 422*c* to the edge 426 of the mask sheet 422 may be the same. In this case, an outermost portion of each body part may be a portion having a shortest straight-line distance to the edge 426 of the mask sheet 422. The second part 422*b* and the third body part 422*c* may have relatively a same size and shape.

A plurality of auxiliary sub-pixel opening portions 424*b* and a plurality of correction opening portions 424*c* may be provided. In this case, the auxiliary sub-pixel opening portions 424*b* may be arranged to correspond to an arrangement of auxiliary pixels for representing one color. In the above case, a sum of the areas of a plurality of auxiliary sub-pixel opening portions 424*b* located in one second body part 422*b* may be the same as a sum of the areas of a plurality of correction opening portions 424*c* located in one third body part 422*c*. In another embodiment, a sum of the areas of a plurality of auxiliary sub-pixel opening portions 424*b* located in a plurality of second body parts 422*b* may be the same as a sum of the areas of a plurality of correction opening portions 424*c* located in a plurality of third body parts 422*c*. For convenience of explanation, the following will be described assuming that a sum of the areas of a plurality of auxiliary sub-pixel opening portions 424*b* located in one second body part 422*b* is the same as a sum of the areas of a plurality of correction opening portions 424*c* located in one third body part 422*c*.

The support frame 423 may be located at an opening portion of the mask frame 421, and may shield the space 425 between adjacent mask sheets 422 or may be located in a direction perpendicular to the longitudinal direction of the mask sheet 422.

In this case, components of the support frame 423 located in a direction perpendicular to the longitudinal direction of the mask sheet 422 may be located to completely shield the third body part 422*c*. That is, because the support frame 423 is located to completely shield the correction opening portions 424*c* of the third body part 422*c*, a deposition material may be prevented from passing through the correction opening portions 424*c*.

The mask assembly 420 may be manufactured by combining the mask sheet 422 and the support frame 423 on the mask frame 421. In this case, the mask sheet 422 may be elongated and may be fixed to the mask frame 421 in that manner by welding.

In this case, when only the second body part 422*b* is provided in the mask sheet 422, the mask sheet 422 may be distorted due to the second body part 422*b*. For example, because a shape of the main sub-pixel opening portion 424*a* and a shape of the auxiliary sub-pixel opening portion 424*b* are different from each other, a whole surface of the mask sheet 422 may not be uniformly deformed and stress may concentrate on a portion of the mask sheet 422 when the mask sheet 422 is elongated and fixed on the mask frame. Also, because the second body part 422*b* is located close to the outer side 426 of the mask sheet 422, the mask sheet 422 may be unexpectedly deformed due to the second body part 422*b*. In this case, even when the mask assembly 420 is completely manufactured and then a deposition process is performed on a display substrate D through the mask assembly 420, processes may find difficulty depositing a deposition material on the display substrate D in a uniform pattern.

However, because the third body part 422*c* is located opposite to the second body part 422*b* as described above, deformation of the mask sheet 422 due to the second body part 422*b* may also occur similarly in a portion where the third body part 422*c* is located.

Accordingly, the mask assembly 420 may prevent abnormal deformation of the mask sheet 422 when the mask sheet 422 is fixed to the mask frame 421.

The substrate 100 may be seated on the first support 430. In this case, the first support 430 may adjust a position of the substrate 100. For example, the first support 430 may include a UVW stage.

The mask assembly 420 may be seated on the second support 440. In this case, the second support 440 may adjust a position of the mask assembly 420, like the first support 430.

At least one of the first support 430 and the second support 440 may be raised or lowered inside the chamber 410. In this case, at least one of the first support 430 and the second support 440 may adjust an interval between the display substrate D and the mask frame 421.

The deposition source 450 may receive a deposition material, and then may supply the deposition material to the chamber 410 by vaporizing or subliming the deposition material. In this case, the deposition source 450 may include a heater inside the deposition source 450, and the deposition source 450 may melt or sublime the deposition material by heating the deposition material inside the deposition source 450 by using the heater. In the above case, the deposition source 450 may be located at the center or on an edge of the chamber 410. For convenience of explanation, the following will be described assuming that the deposition source 450 is located on the edge of the chamber 410.

The magnetic force generator 460 may be located in the chamber 410 and may attach the substrate 100 and the mask assembly 420. In this case, the magnetic force generator 460 may include an electromagnet or a permanent magnet that generates a magnetic force.

The vision unit 470 may be located at the chamber 410 and may capture images of positions of the mask assembly 420 and the substrate 100. In this case, the vision unit 470 may capture an image of an alignment mark of at least one of the mask assembly 420 and the substrate 100.

The pressure regulator 480 may be connected to the chamber 410 and may regulate a pressure inside the chamber 410. In this case, the pressure regulator 480 may include a connection pipe 481 connected to the chamber 410 and a pump 482 located on the connection pipe 481.

Upon examining an operation of the apparatus 400, the display substrate D and the mask assembly 420 may be introduced into the chamber 410. In this case, the display substrate D may be a stacked structure from the buffer layer 111 on the substrate 100 to the first functional layer 222*a* in FIGS. 6 through 8.

Images of the display substrate D and the mask assembly 420 may be captured by using the vision unit 470, and the display substrate D and the mask assembly 420 may be aligned by adjusting a position of at least one of the display substrate D and the mask assembly 420 based on the images of the display substrate D and the mask assembly 420. Next, the mask assembly 420 and the display substrate D may be attached by using the magnetic force generator 460.

When the deposition source 450 supplies a deposition material, the deposition material may pass through the mask assembly 420 and may be deposited on the display substrate D. In this case, the deposition material may be deposited on the display substrate D to form a main emission layer (not illustrated) and an auxiliary emission layer (not illustrated). In the above case, the pressure regulator 480 may discharge a gas inside the chamber 410 to the outside.

Blue, red, and green emission layers may be formed sequentially in different apparatuses (not illustrated) to manufacture display apparatuses. In this case, different mask assemblies 420 may be used according to emission layers. For example, a mask assembly including a first mask sheet (not illustrated) may be used to locate a blue emission layer on the display substrate D, and a mask assembly including a second mask sheet (not illustrated) may be used to locate a red emission layer on the display substrate D. Also, a mask assembly including a third mask sheet (not illustrated) may be used to locate a green emission layer on the display substrate D.

After each emission layer is formed, a display apparatus may be manufactured by sequentially forming a second functional layer (not illustrated), a counter electrode (not illustrated), and an encapsulation member.

Accordingly, because the apparatus 400 uses the mask assembly 420 with minimal deformation, the apparatus 400 may form an emission layer on the display substrate D in a precise pattern.

The apparatus 400 may minimize defects in the manufacture of a display apparatus.

Figure 12A:
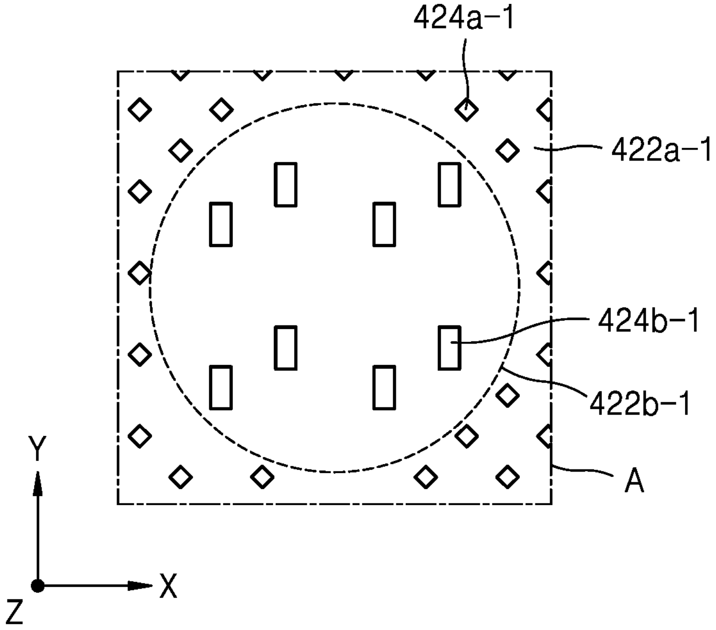
FIGS. 12A and 12B are plan views illustrating a part of a first mask sheet of an apparatus for manufacturing a display apparatus according to an embodiment of the inventive concepts.
Figure 12B:
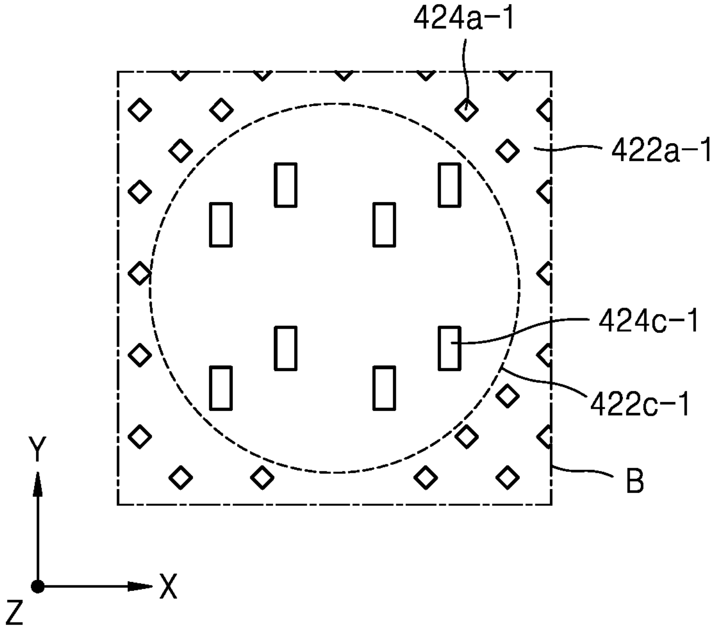

FIGS. 12A and 12B are plan views illustrating a part of a first mask sheet of an apparatus for manufacturing a display apparatus according to an embodiment of the inventive concepts.

Referring to FIGS. 12A and 12B, a first mask sheet (not illustrated) may be similar to the mask sheet 422 of FIG. 10. In this case, first main sub-pixel opening portions 424*a*-1 may be located in the first body part 422*a* of the first mask sheet, and first auxiliary sub-pixel opening portions 424*b*-1 may be located in the second body part 422*b* of the first mask sheet. Also, first correction opening portions 424*c*-1 may be located in the third body part 422*c* of the first mask sheet. In this case, the first main sub-pixel opening portions 424*a*-1 may be formed to correspond to first main sub-pixels (not illustrated). Also, the first auxiliary sub-pixel opening portions 424*b*-1 may be formed to correspond to first auxiliary sub-pixels (not illustrated). A deposition material passing through the first main sub-pixel opening portions 424*a*-1 and the first auxiliary sub-pixel opening portions 424*b*-1 may form an emission layer located in the first main sub-pixels and the first auxiliary sub-pixels.

In the above case, the first correction opening portions 424*c*-1 of the third body part 422*c* of the first mask sheet may be arranged in the same pattern with the same size and the same shape as those of the first auxiliary sub-pixel opening portions 424*b*-1.

In the above case, a distance from an edge of the second body part 422*b* to the edge 426 of the first mask sheet and a distance from an edge of the third body part 422*c* to the edge 426 of the first mask sheet may be the same as illustrated in FIG. 11.

Also, when a plurality of second body parts 422*b* and third body parts 422*c* are provided, the second body parts 422*b* and the third body parts 422*c* may be arranged in a zigzag shape as illustrated in FIG. 11. In particular, the plurality of second body parts 422*b* may be aligned with one another, and the plurality of third body parts 422*c* may be aligned with one another. In this case, the plurality of second body parts 422*b* and the plurality of third body parts 422*c* may be located opposite to each other with respect to an arbitrary straight line parallel to a longitudinal direction of the first mask sheet and passing through the center of the first mask sheet.

Figure 13A:
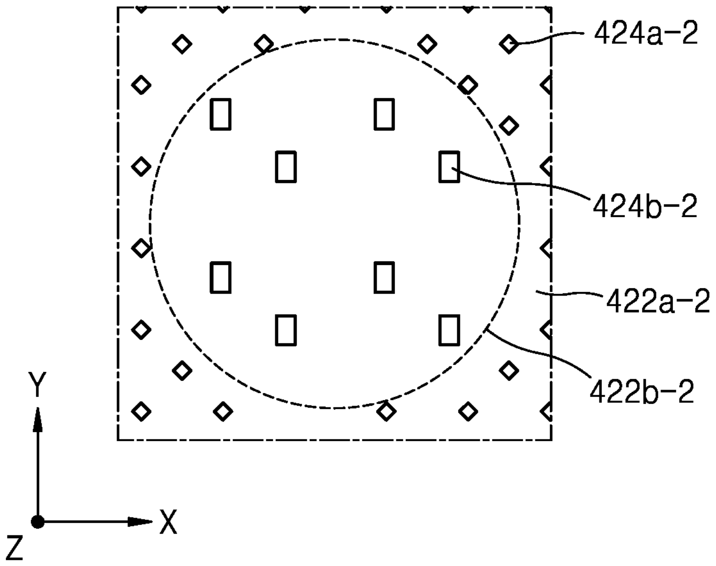
FIGS. 13A and 13B are plan views illustrating a part of a second mask sheet of an apparatus for manufacturing a display apparatus according to an embodiment of the inventive concepts.
Figure 13B:
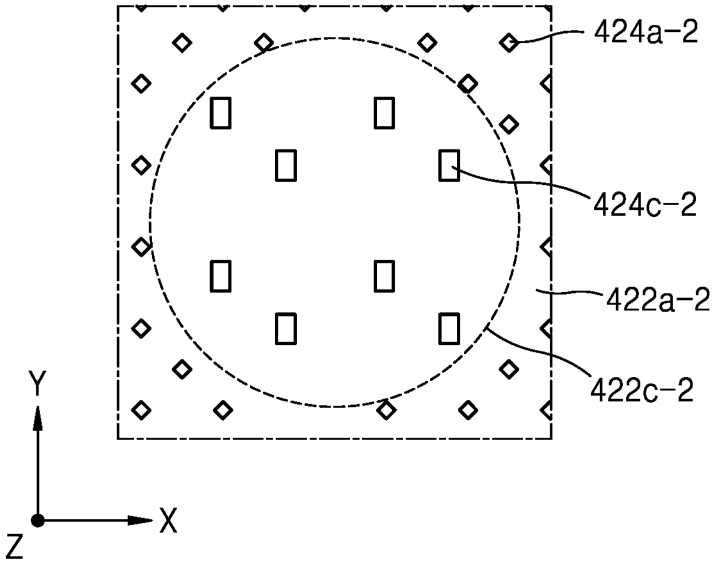

FIGS. 13A and 13B are plan views illustrating a part of a second mask sheet of an apparatus for manufacturing a display apparatus according to an embodiment of the inventive concepts.

Referring to FIGS. 13A and 13B, second main sub-pixel opening portions 424*a*-2 may be located in the first body part 422*a* of a second mask sheet (not illustrated). In this case, the second main sub-pixel opening portions 424*a*-2 may be located at positions different from those of the first main sub-pixel opening portions 424*a*-1. In this case, a deposition material passing through the second main sub-pixel opening portions 424*a*-2 may form an emission layer located in second main sub-pixels (not illustrated). In this case, deposition materials passing through the first main sub-pixel opening portions 424*a*-1 and the second main sub-pixel opening portions 424*a*-2 may be different from each other.

Second auxiliary sub-pixel opening portions 424*b*-2 located in the second body part 422*b* of the second mask sheet may be located to correspond to second auxiliary sub-pixels (not illustrated). The second auxiliary sub-pixel opening portions 424*b*-2 may be formed so that the second auxiliary sub-pixel opening portions 424*b*-2 and the first auxiliary sub-pixel opening portions 424*b*-1 do not overlap each other when the first mask sheet (not illustrated) and the second mask sheet are stacked. Also, shapes and sizes of the first auxiliary sub-pixel opening portions 424*b*-1 may be different from shapes and sizes of the second auxiliary sub-pixel opening portions 424*b*-2.

In the above case, a distance from an edge of the second body part 422*b* to the edge 426 of the second mask sheet and a distance from an edge of the third body part 422*c* to the edge 426 of the second mask sheet may be the same as illustrated in FIG. 11.

Also, when a plurality of second body parts 422*b* and third body parts 422*c* are provided, the second body parts 422*b* and the third body parts 422*c* may be arranged in a zigzag shape as illustrated in FIG. 11. In particular, the plurality of second body parts 422*b* may be aligned with one another, and the plurality of third body parts 422*c* may be aligned with one another. In this case, the plurality of second body parts 422*b* and the plurality of third body parts 422*c* may be located opposite to each other with respect to an arbitrary straight line parallel to a longitudinal direction of the second mask sheet and passing through the center of the second mask sheet.

Second correction opening portions 424*c*-2 may be located in the third body part 422*c*. In this case, the second correction opening portions 424*c*-2 may be formed in the same manner as or a similar manner to that of the second auxiliary sub-pixel opening portions 424*b*-2. Also, when a plurality of second correction opening portions 424*c*-2 are provided, the second correction opening portions 424*c*-2 may be arranged in the third body part 422*c* in the same manner as that of the plurality of second auxiliary sub-pixel opening portions 424*b*-2.

Figure 14A:
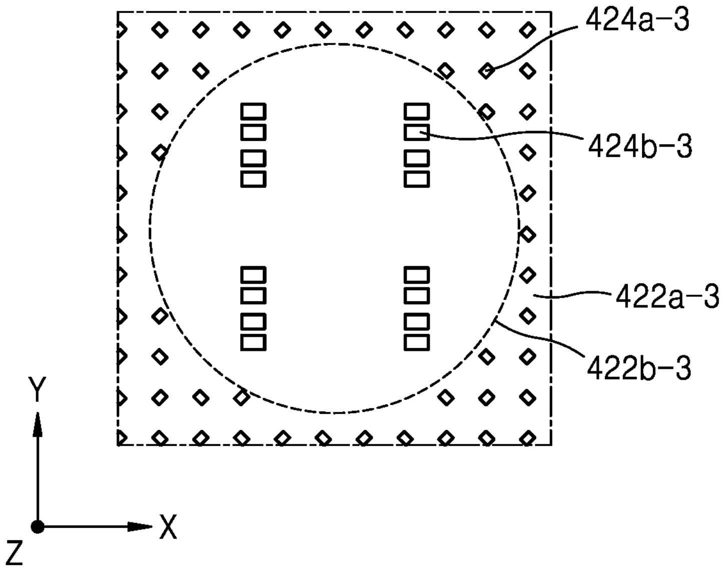
FIGS. 14A and 14B are plan views illustrating a part of a third mask sheet of an apparatus for manufacturing a display apparatus according to an embodiment of the inventive concepts.
Figure 14B:
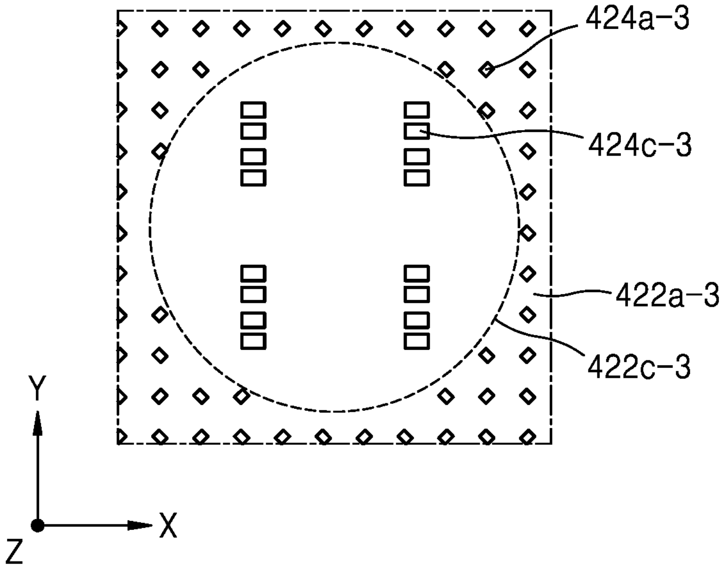

FIGS. 14A and 14B are plan views illustrating a part of a third mask sheet of an apparatus for manufacturing a display apparatus according to an embodiment of the inventive concepts.

Referring to FIGS. 14A and 14B, a third mask sheet (not illustrated) may include the first body part 422*a* including third main sub-pixel opening portions 424*a*-3, the second body part 422*b* including third auxiliary sub-pixel opening portions 424*b*-3, and the third body part 422*c* including third correction opening portions 424*c*-3.

In the above case, the first body part 422*a* through the third body part 422*c* may be similar to those in FIG. 11.

In the above case, the third main sub-pixel opening portions 424*a*-3 and the third auxiliary sub-pixel opening portions 424*b*-3 may be formed to respectively correspond to third main pixels (not illustrated) and third auxiliary pixels (not illustrated). In this case, a deposition material may pass through the third main sub-pixel opening portions 424*a*-3 and the third auxiliary sub-pixel opening portions 424*b*-3 and may form emission layers of the third main pixels and the third auxiliary pixels.

In the above case, a distance from an edge of the second body part 422*b* to the edge 426 of the third mask sheet and a distance from an edge of the third body part 422*c* to the edge 426 of the third mask sheet may be the same as illustrated in FIG. 11.

Also, when a plurality of second body parts 422*b* and a plurality of third body parts 422*c* are provided, the second body parts 422*b* and the third body parts 422*c* may be arranged in a zigzag shape as illustrated in FIG. 11. In particular, the plurality of second body parts 422*b* may be aligned with one another, and the plurality of third body parts 422*c* may be aligned with one another. In this case, the plurality of second body parts 422*b* and the plurality of third body parts 422*c* may be located opposite to each other with respect to an arbitrary straight line parallel to a longitudinal direction of the third mask sheet and passing through the center of the third mask sheet.

Third body parts of the first mask sheet through the third mask sheet may be modified in various other ways. In this case, because deformations of the first mask sheet through the third mask sheet are similar to one another, deformation of the third body part of the first mask sheet will be described in detail.

Figure 15:
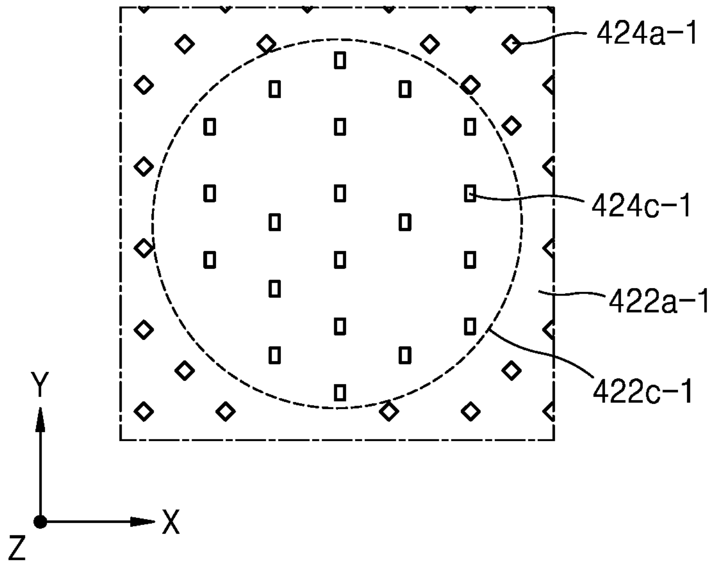
FIG. 15 is a plan view illustrating a part of a first mask sheet of an apparatus for manufacturing a display apparatus according to another embodiment of the inventive concepts.

FIG. 15 is a plan view illustrating a part of a first mask sheet of an apparatus for manufacturing a display apparatus according to another embodiment of the inventive concepts.

Referring to FIG. 15, a first mask sheet (not illustrated) may include a first body part 422*a*-1 including the first main sub-pixel opening portions 424*a*-1, a second body part (not illustrated) including first auxiliary sub-pixel opening portions (not illustrated), and a third body part 422*c*-1 including the first correction opening portions 424*c*-1. In this case, the first body part 422*a*-1 and the second body part are the same as or similar to those of FIGS. 11 through 12B, and thus a detailed explanation thereof will be omitted.

The third body part 422*c*-1 may include a plurality of first correction opening portions 424*c*-1. In this case, the first correction opening portions 424*c*-1 and the first auxiliary sub-pixel opening portions 424_b_-1 may be different from each other in at least one of sizes and shapes. For convenience of explanation, the following will be described assuming that sizes of the first correction opening portions 424_c_-1 and the first auxiliary sub-pixel opening portions 424_b_-1 are different from each other.

When a size of each first correction opening portion 424_c_-1 is less than a size of each first auxiliary sub-pixel opening portion 424_b_-1, the number of first correction opening portions 424_c_-1 may be greater than the number of first auxiliary sub-pixel opening portions 424_b_-1. In contrast, when a size of each first correction opening portion 424_c_-1 is greater than a size of each first auxiliary sub-pixel opening portion 424_b_-1, the number of first correction opening portions 424_c_-1 may be less than the number of first auxiliary sub-pixel opening portions 424_b_-1.

In the above, case, a sum of the areas of a plurality of first correction opening portions 424_c_-1 may be the same as a sum of the areas of a plurality of first auxiliary sub-pixel opening portions 424_b_-1.

In the above case, because a sum of the areas of the plurality of first correction opening portions 424_c_-1 is the same as a sum of the areas of the plurality of first auxiliary sub-pixel opening portions 424_b_-1, the amounts of deformation occurring on both side surfaces of the first mask sheet may be kept almost similar to each other when the first mask sheet is elongated.

Although not illustrated in FIG. 15, the above description may also apply to a second mask sheet (not illustrated) and a third mask sheet (not illustrated).

Figure 16:
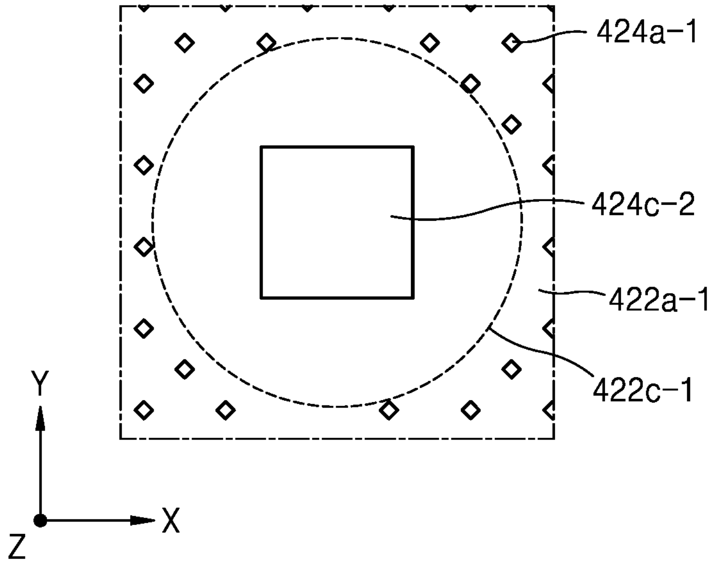
FIG. 16 is a plan view illustrating a first mask sheet of an apparatus for manufacturing a display apparatus according to another embodiment of the inventive concepts.

FIG. 16 is a plan view illustrating a first mask sheet of an apparatus for manufacturing a display apparatus according to another embodiment of the inventive concepts.

Referring to FIG. 16, a first mask sheet (not illustrated) may include the third body part 422_c_-1 including one first correction opening portion 424_c_-2. In this case, a shape and a size of the first correction opening portion 424_c_-1 may be different from a shape and a size of a first auxiliary sub-pixel opening portion (not illustrated). For example, the first auxiliary sub-pixel opening portion may have a rectangular shape as illustrated in FIG. 12A. In this case, the first correction opening portion 424_c_-1 may have a square shape as illustrated in FIG. 16.

In the above case, a size of the first correction opening portion 424_c_-2 may be greater than a size of the first auxiliary sub-pixel opening portion 424_b_-1. In this case, the area of the first correction opening portion 424_c_-2 may be the same as a sum of the areas of a plurality of first auxiliary sub-pixel opening portions 424_b_-1 located inside a second body part (not illustrated) in a plan view.

In the above case, because a sum of respective areas of a plurality of first correction opening portions 424_c_-1 and the first correction portion 424_c_-2 are the same as a sum of the areas of a plurality of first auxiliary sub-pixel opening portions 424_b_-1, the amounts of deformation occurring on both side surfaces of the first mask sheet 422 may be kept almost similar to each other when the first mask sheet 422 is elongated.

Although not illustrated in FIG. 16, the above description may also apply to a second mask sheet (not illustrated) and a third mask sheet (not illustrated).

Figure 17:
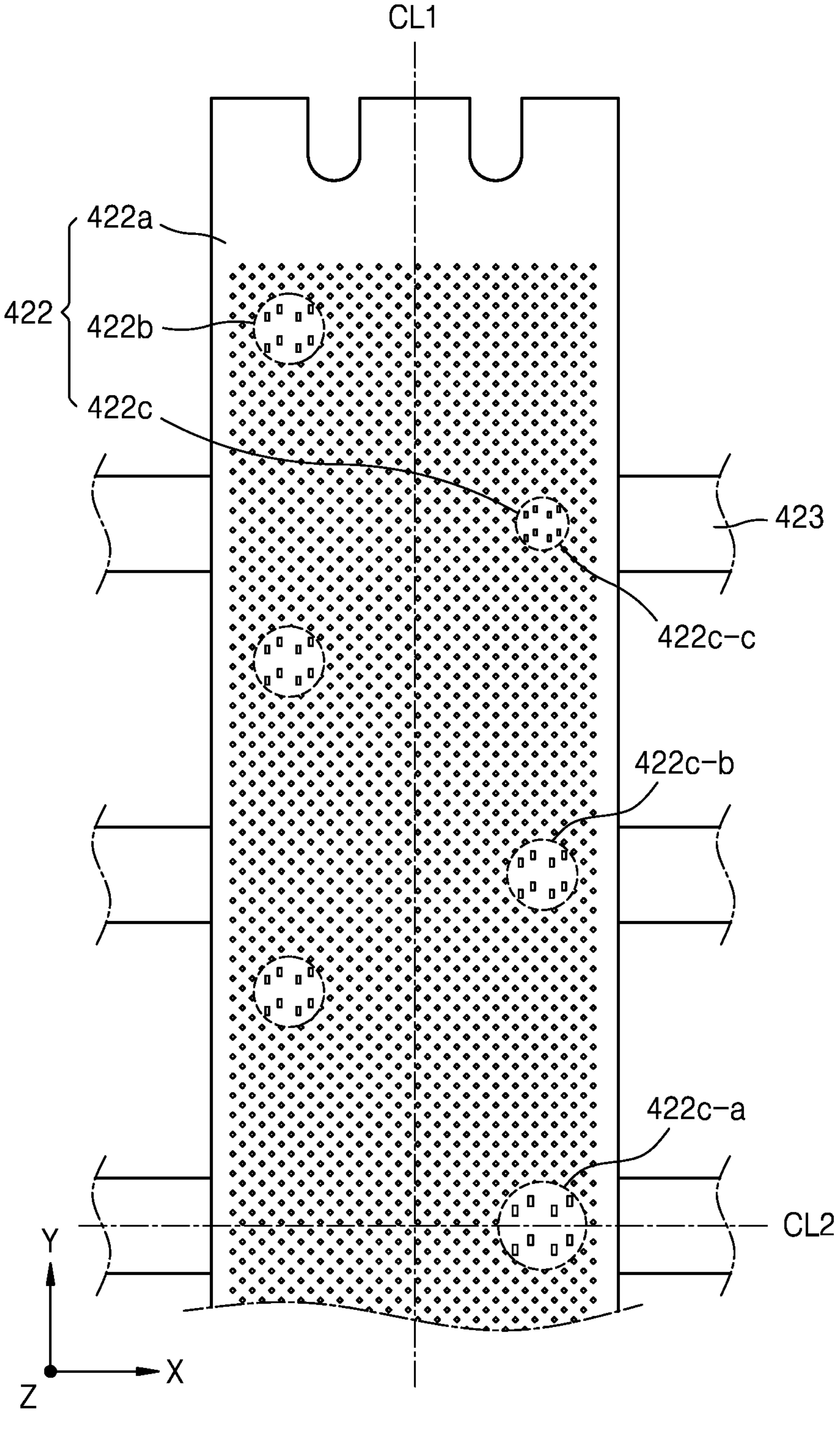
FIG. 17 is a plan view illustrating a part of a mask sheet of an apparatus for manufacturing a display apparatus according to another embodiment of the inventive concepts.

FIG. 17 is a plan view illustrating a part of a mask sheet of an apparatus to manufacture a display apparatus according to another embodiment of the inventive concepts.

Referring to FIG. 17, the mask sheet 422 may include a first mask sheet (not illustrated), a second mask sheet (not illustrated), and a third mask sheet (not illustrated) having opening portions formed to respectively correspond to positions of emission layers.

In the above case, the mask sheet 422 may include the first body part 422_a_ including the main sub-pixel opening portions 424_a_, the second body part 422_b_ including the auxiliary sub-pixel opening portions 424_b_, and the third body part 422_c_ including the correction opening portions 424_c_.

In the above case, the first body part 422_a_ and the second body part 422_b_ may be formed as illustrated in FIG. 11. The third body parts 422_c_ may be formed symmetric to each other with respect to a second center line CL2 perpendicular to the first center line CL1 and passing through the center of the mask sheet 422. In this case, when a plurality of third body parts 422_c_ are provided, the areas of the third body parts 422_c_ may decrease or increase in size away from the second center line CL2 in a plan view. In this case, the correction opening portions 424_c_ located inside each third body part 422_c_ may be formed to have many various shapes. For example, the correction opening portions 424_c_ may have shapes as illustrated in FIG. 12B, 15, or 16. The second part 422_b_ and the third body part 422_c_ may have relatively a same shape. The third body part 422_c_ may have various sizes of a single shape.

In the above case, a sum of the areas of the auxiliary sub-pixel opening portions 424_b_ located inside a plurality of second body parts 422_b_ may be the same as a sum of the areas of the correction opening portions 424_c_. That is, a sum of the areas of the auxiliary sub-pixel opening portions 424_b_ located in the mask sheet 422 may be the same as a sum of the areas of the correction opening portions 424_c_ located in the mask sheet 422.

In the above case, because a sum of the areas of the auxiliary sub-pixel opening portions 424_b_ and a sum of the areas of the correction opening portions 424_c_ located on both side surfaces of the mask sheet 422 are the same, it may be possible to prevent the mask sheet 422 from being distorted or stress from concentrating on a portion of the mask sheet 422 when the mask sheet 422 is elongated.

Although not illustrated in FIG. 17, the above description may also apply to a first mask sheet (not illustrated), a second mask sheet (not illustrated), and a third mask sheet (not illustrated).

Figure 18:
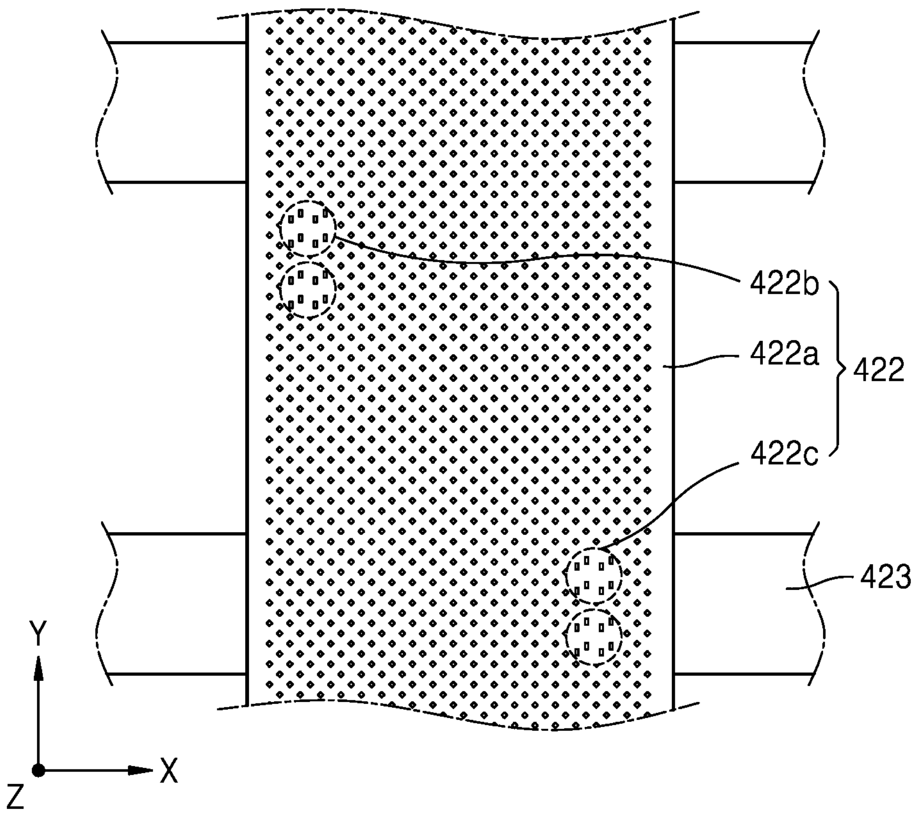
FIG. 18 is a plan view illustrating a part of a mask sheet of an apparatus for manufacturing a display apparatus according to another embodiment of the inventive concepts.

FIG. 18 is a plan view illustrating a part of a mask sheet of an apparatus for manufacturing a display apparatus according to another embodiment of the inventive concepts.

Referring to FIG. 18, in the mask sheet 422, one pair of second body parts 422_b_ may be formed between adjacent support frames 423. In this case, the mask sheet 422 may include one pair of third body parts 422_c_ each having the same shape as that of each of the second body parts 422_b_. In another embodiment, when one pair of second body parts 422_b_ have different shapes, one pair of third body parts 422_c_ may have different shapes to correspond to the one pair of second body parts 422_b_. In this case, the auxiliary sub-pixel opening portions 424_b_ and the correction opening portions 424_c_ may be formed to have many various shapes. In another embodiment, even when one pair of second body parts 422_b_ have the same shape, one pair of third body parts 422_c_ may be formed to have different shapes. For example, each third body part 422_c_ may have many various shapes as described above. In this case, the auxiliary sub-pixel opening portions 424_b_ and the correction opening portions 424_c_ may also be formed to have many various shapes as described above.

In other cases, shapes of the third body part 422_c_ and the correction opening portions 424_c_ may be combined in various ways as described above. In this case, as described above, shapes and sizes of the second body part 422*b*, the auxiliary sub-pixel opening portions 424*b*, the third body part 422*c*, and the correction opening portions 424*c* may be determined so that a sum of the areas of the auxiliary sub-pixel opening portions 424*b* and a sum of the areas of the correction opening portions 424*c* located in one mask sheet 422 are the same. The second part 422*b* and the third body part 422*c* may have relatively the same size and shape.

Accordingly, because the mask sheet 422 is uniformly deformed when the mask sheet 422 is located on a mask frame (not illustrated), a precise deposition pattern may be formed. Also, distortion of the mask sheet 422 may be minimized.

Although not illustrated in FIG. 18, the above description may also apply to a first mask sheet (not illustrated), a second mask sheet (not illustrated), and a third mask sheet (not illustrated).

Although not illustrated in FIG. 18, when a display apparatus (not illustrated) is manufactured by using the first mask sheet through the third mask sheet, two second display areas DA2 of FIG. 1 may be located adjacent to each other in the first display area DA1.

Figure 19:
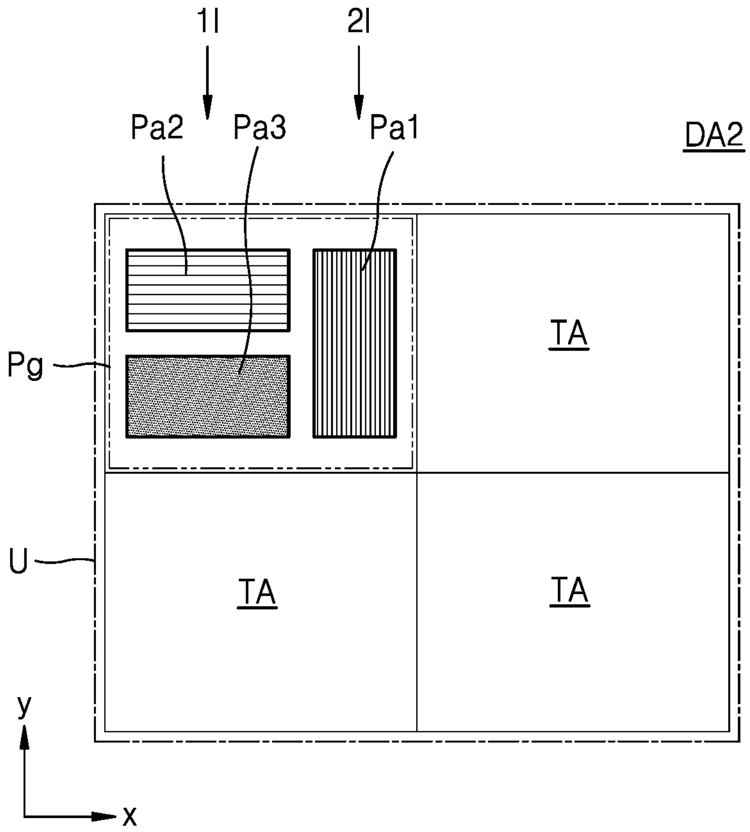
FIG. 19 is a plan view illustrating an arrangement of sub-pixels and a transmission area located in a second display area of a display apparatus according to another embodiment of the inventive concepts.

FIG. 19 is a plan view illustrating an arrangement of sub-pixels and a transmission area located in a second display area of a display apparatus according to another embodiment of the inventive concepts.

Referring to FIG. 19, a pixel arrangement structure of the second display area DA2 may be an S-stripe structure. In the present embodiment, one auxiliary emission area Pg may include three auxiliary sub-pixels Pa including one second auxiliary sub-pixel Pa2, one third auxiliary sub-pixel Pa3, and one first auxiliary sub-pixel Pa1.

In the present embodiment, the second auxiliary sub-pixel Pa2 and the third auxiliary sub-pixel Pa3 may be alternately arranged in a first column 1I, and the first auxiliary sub-pixel Pa1 may be located in a second column 2I adjacent to the first column 1I. In this case, each of the second auxiliary sub-pixel Pa2 and the third auxiliary sub-pixel Pa3 may have a quadrangular shape having a long side in an X-direction, and the first auxiliary sub-pixel Pa1 may have a quadrangular shape having a long side in a Y-direction. A length of the first auxiliary sub-pixel Pa1 in the Y-direction may be equal to or greater than a sum of a length of the second auxiliary sub-pixel and a length of the third auxiliary sub-pixel Pa3 in the Y-direction. Accordingly, a size of the first auxiliary sub-pixel Pa1 may be greater than a size of each of the second auxiliary sub-pixel Pa2 and the third auxiliary sub-pixel Pa3.

In the present embodiment, an area occupied by one auxiliary emission area Pg in the base unit U may be about ¼ of that of the basic unit U. Although the basic unit U includes only one auxiliary emission area Pg in FIG. 19, in another embodiment, the basic unit U may include two or more auxiliary emission areas Pg. Also, the areas of the auxiliary sub-pixels Pa included in the auxiliary emission area Pg may be modified in various ways.

In the above case, sub-pixels located in a first display area (not illustrated) may be the same as those described with reference to FIG. 5.

Figure 20:
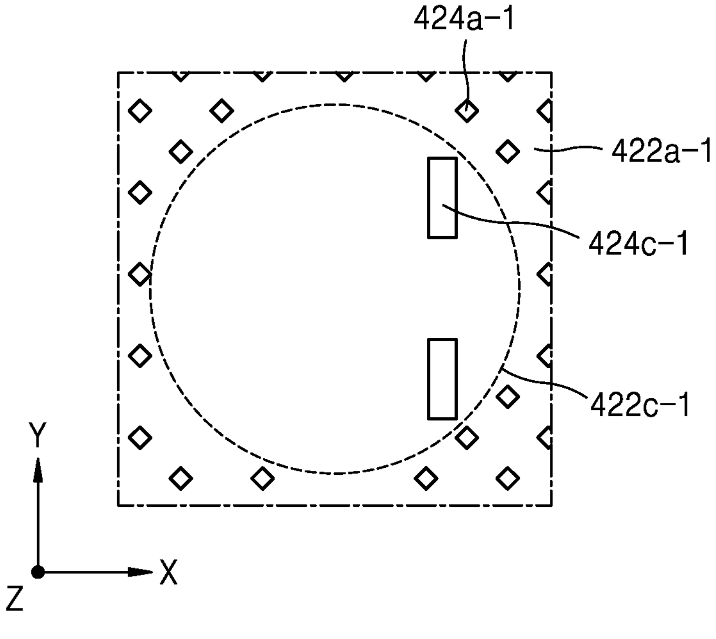
FIG. 20 is a plan view illustrating a part of a first mask sheet of an apparatus for manufacturing a display apparatus according to another embodiment of the inventive concepts.

FIG. 20 is a plan view illustrating a part of a first mask sheet of an apparatus for manufacturing a display apparatus according to another embodiment of the inventive concepts.

Referring to FIG. 20, a first mask sheet (not illustrated) may include the third body part 422*c*-1 in which the first correction opening portions 424*c*-1 are located. In this case, the first correction opening portions 424*c*-1 may have shapes substantially the same as or similar to shapes of first auxiliary sub-pixels of FIG. 19. In this case, the third body part 422*c*-1 and the first correction opening portions 424*c*-1 are not limited thereto, and may have many various shapes.

When shapes of first auxiliary sub-pixels are different from shapes of first main sub-pixels as described herein, because the first main sub-pixel opening portions 424*a*-1 forming a pattern of the first main sub-pixels and the first auxiliary sub-pixel opening portions 424*b*-1 forming a pattern of the first auxiliary sub-pixels are different from each other, the first mask sheet may be distorted or the first mask sheet may not be uniformly deformed when the first mask sheet is elongated.

In order to address these and other issues, when the third body part 422*c*-1 having the same shape as that of a second body part (not illustrated) is located diagonal to the second body part in a longitudinal direction of the mask sheet as described herein, deformation of the mask sheet may be minimized and, if any, may be made uniformly to some extent on a front surface of the mask sheet. In particular, while a side surface of the mask sheet and another portion of the mask sheet may be differently deformed due to the second body part, if the third body part 422*c*-1 is provided, a portion of the mask sheet where the third body part 422*c*-1 is located and a portion of the mask sheet where the second body part is located may be similarly deformed.

Accordingly, because the mask sheet used to form sub-pixels having a shape different from that of a first display area in a second display area is expectably deformed or uniformly deformed, a display apparatus having a precise pattern may be manufactured.

Shapes and the number of first correction opening portions 424*c*-1 of the third body part 422*c*-1 are not limited thereto, and may be modified in the same manner as or a similar manner to that described above.

Although not illustrated in FIG. 20, the above description may also apply to a second mask sheet (not illustrated) and a third mask sheet (not illustrated).

Figure 21:
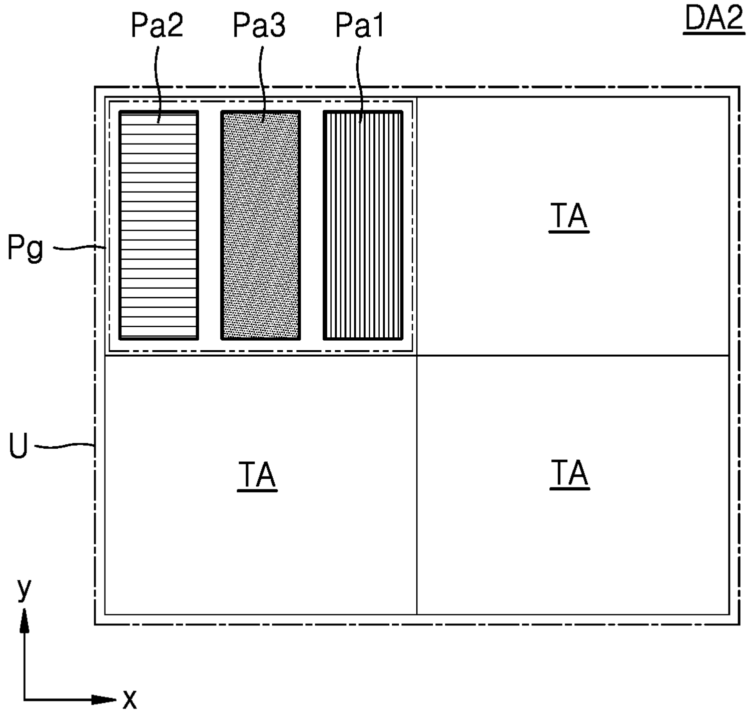
FIG. 21 is a plan view illustrating an arrangement of sub-pixels and a transmission area located in a second display area of a display apparatus according to another embodiment of the inventive concepts.

FIG. 21 is a plan view illustrating an arrangement of sub-pixels and a transmission area located in a second display area of a display apparatus according to another embodiment of the inventive concepts.

Referring to FIG. 21, a pixel arrangement structure of the second display area DA2 may be a stripe structure. That is, the second auxiliary sub-pixel Pa2, the third auxiliary sub-pixel Pa3, and the first auxiliary sub-pixel Pa1 may be arranged in parallel in an X-direction. In this case, the second auxiliary sub-pixel Pa2, the third auxiliary sub-pixel Pa3, and the first auxiliary sub-pixel Pa1 may have long sides in a Y-direction.

Alternatively, the second auxiliary sub-pixel Pa2, the third auxiliary sub-pixel Pa3, and the first auxiliary sub-pixel Pa1 may be arranged in parallel in the Y-direction. In this case, the second auxiliary sub-pixel Pa2, the third auxiliary sub-pixel Pa3, and the first auxiliary sub-pixel Pa1 may have long sides in the X-direction.

In the above case, sub-pixels located in a first display area (not illustrated) may be the same as those in FIG. 5.

Figure 22:
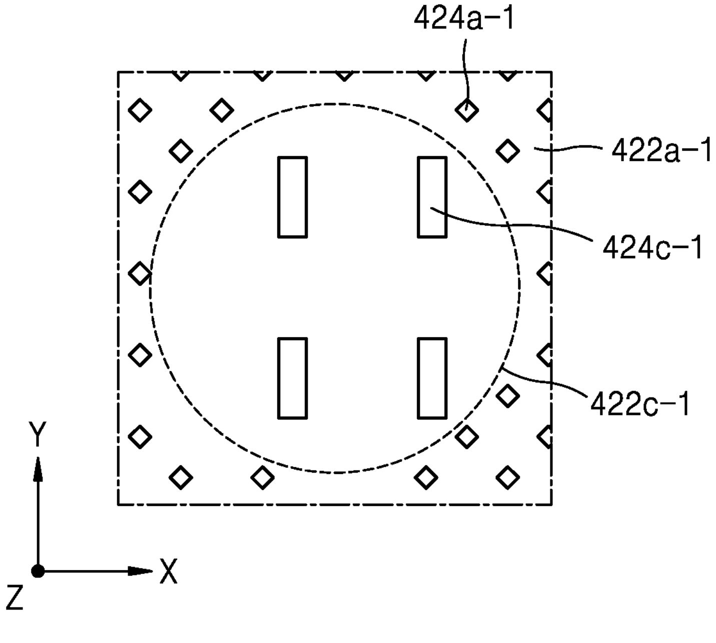
FIG. 22 is a plan view illustrating a part of a first mask sheet of an apparatus for manufacturing a display apparatus according to another embodiment of the inventive concepts.

FIG. 22 is a plan view illustrating a part of a first mask sheet of an apparatus for manufacturing a display apparatus according to another embodiment of the inventive concepts.

Referring to FIG. 22, a first mask sheet (not illustrated) may include the third body part 422*c*-1 in which the first correction opening portions 424*c*-1 are located. In this case, the first correction opening portions 424*c*-1 may have shapes substantially the same as or similar to shapes of first auxiliary sub-pixels of FIG. 21. In this case, the third body part 422*c*-1 and the first correction opening portions 424*c*-1 are not limited thereto, and may have many various shapes.

A plurality of first correction opening portions 424*c*-1 may be provided inside the third body part 422*c*-1 as illustrated in FIG. 22. The plurality of first correction opening portions 424*c*-1 may be spaced apart from one another. Various shapes and numbers of first correction opening portions 424*c*-1 may be provided as described above. In this case, shapes and the number of first correction opening portions 424*c*-1 may be adjusted so that a sum of the areas of the first correction opening portions 424*c*-1 is the same as a sum of the areas of the first auxiliary sub-pixel opening portions 424*b*-1.

Accordingly, because the mask sheet used to form sub-pixels having a shape different from that of a first display area in a second display area is expectably or uniformly deformed, a display apparatus having a precise pattern may be manufactured.

Although not illustrated in FIG. 22, the above description may also apply to a second mask sheet (not illustrated) and a third mask sheet (not illustrated).

Figure 23:
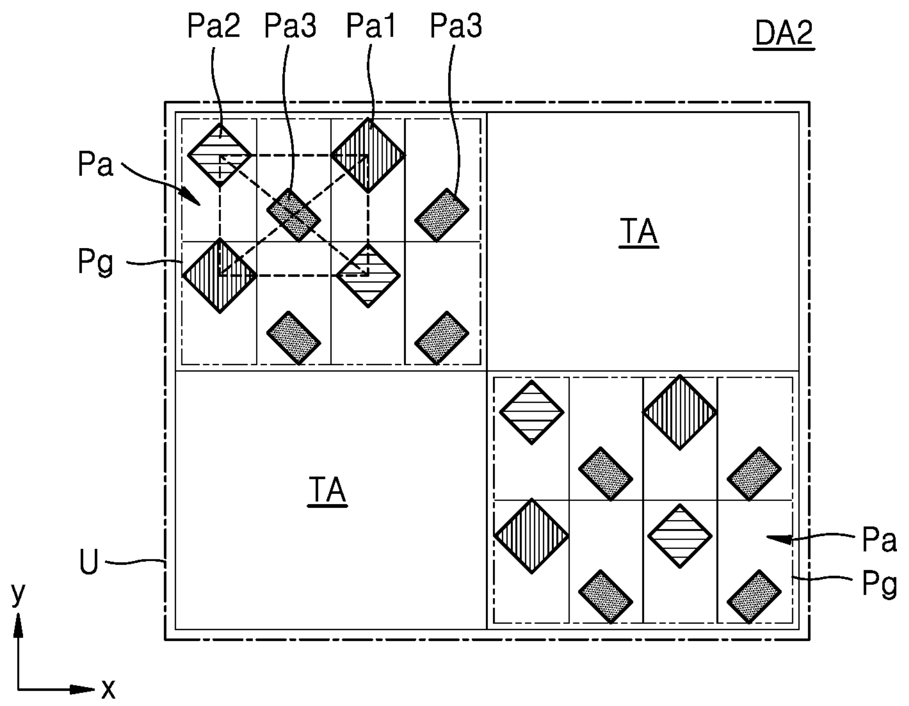
FIG. 23 is a plan view illustrating an arrangement of sub-pixels and a transmission area located in a second display area of a display apparatus according to another embodiment of the inventive concepts.

FIG. 23 is a plan view illustrating an arrangement of sub-pixels and a transmission area located in a second display area of a display apparatus according to another embodiment of the inventive concepts.

Referring to FIG. 23, a plurality of auxiliary sub-pixels Pa may be located in the second display area DA2. Each of the auxiliary sub-pixels Pa may emit one of red light, green light, blue light, and white light.

A component area CA may include the transmitting area TA and the auxiliary emission area Pg including at least one auxiliary sub-pixel Pa. The auxiliary emission area Pg and the transmitting area TA may be alternately arranged in an X-direction and a Y-direction, for example, in a lattice shape. In this case, the component area CA may include a plurality of auxiliary emission areas Pg and a plurality of transmitting areas TA.

The auxiliary emission area Pg may be defined as a preset unit in which a plurality of auxiliary sub-pixels Pa are grouped. For example, as illustrated in FIG. 23, one auxiliary emission area Pg may include eight auxiliary sub-pixels Pa arranged in a pentile structure. That is, two second auxiliary sub-pixels Pa2, four third auxiliary sub-pixels Pa3, and two first auxiliary sub-pixels Pa1 may be included in one auxiliary emission area Pg. In this case, the first auxiliary sub-pixel Pa1 may emit blue light, the second auxiliary sub-pixel Pa2 may emit red light, and the third auxiliary sub-pixel Pa3 may emit green light.

The basic unit U in which a certain number of auxiliary emission areas Pg and a certain number of transmitting areas TA are grouped may be repeatedly located in the X-direction and the Y-direction in the component area CA. In FIG. 23, the basic unit U may have a quadrangular shape in which two auxiliary emission areas Pg and two transmitting areas TA around the two auxiliary emission areas Pg are grouped. The basic unit U is a repeating shape and does not mean separation of elements.

A corresponding unit U' having the same area as the area of the basic unit U may be configured in a main display area MDA. In this case, the number of main sub-pixels Pm included in the corresponding unit U' may be greater than the number of auxiliary sub-pixels Pa included in the basic unit U. That is, the number of auxiliary sub-pixels Pa included in the basic unit U may be 16 and the number of main sub-pixels Pm included in the corresponding unit U' may be 32, and a ratio of the number of auxiliary sub-pixels Pa to the number of main sub-pixels Pm per same area may be 1:2.

As illustrated in FIG. 23, an arrangement structure of the auxiliary sub-pixels Pa is a pentile structure, and a pixel arrangement structure of the component area CA whose resolution is one-half (½) of that of the main display area MDA is a ½ pentile structure. The number or an arrangement method of the auxiliary sub-pixels Pa included in the auxiliary emission area Pg may be modified and designed according to a resolution of the component area CA.

Figure 24:
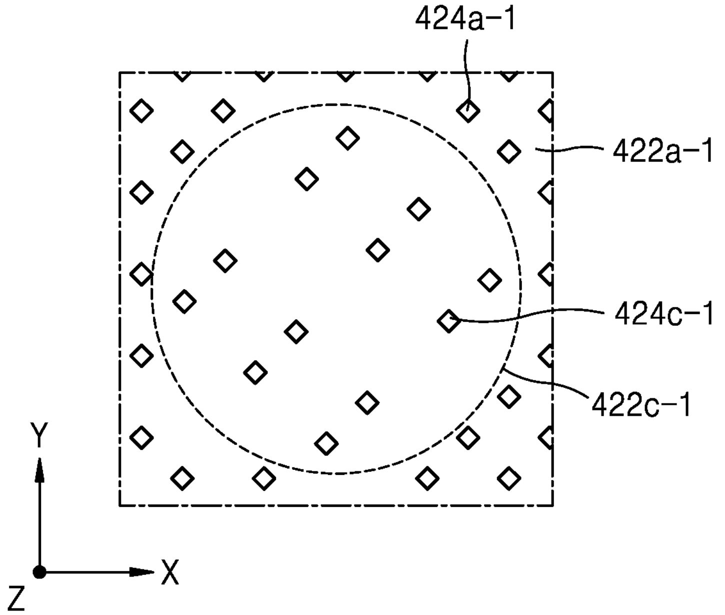
FIG. 24 is a plan view illustrating a part of a first mask sheet of an apparatus for manufacturing a display apparatus according to another embodiment of the inventive concepts.

FIG. 24 is a plan view illustrating a part of a first mask sheet of an apparatus for manufacturing a display apparatus according to another embodiment of the inventive concepts.

Referring to FIG. 24, a first mask sheet (not illustrated) may include the first body part 422*a*-1 in which the first main sub-pixel opening portions 424*a*-1 are located, a second body part (not illustrated) in which first auxiliary sub-pixel opening portions (not illustrated) are located, and a third body part 422*c*-1 in which the first correction opening portions 424*c*-1 are located.

In the above case, the first main sub-pixel opening portions 424*a*-1 and the first auxiliary sub-pixel opening portions may have the same shape. In this case, sizes of the first main sub-pixel opening portions 424*a*-1 and the first auxiliary sub-pixel opening portions may be the same or different from each other.

When the first main sub-pixel opening portions 424*a*-1 and the first auxiliary sub-pixel opening portions have the same shape and the same size, the number of first main sub-pixel opening portions 424*a*-1 or a sum of the areas of the first main sub-pixel opening portions 424*a*-1 per unit area of the first body part 422*a*-1 may be different from the number of first auxiliary sub-pixel opening portions or a sum of the areas of the first auxiliary sub-pixel opening portions per unit area of the second body part. In detail, the number of first main sub-pixel opening portions 424*a*-1 per unit area of the first body part 422*a*-1 may be greater than the number of first auxiliary sub-pixel opening portions per unit area of the second body part. Alternatively, a sum of the areas of the first main sub-pixel opening portions 424*a*-1 per unit area of the first body part 422*a*-1 may be greater than a sum of the areas of the first auxiliary sub-pixel opening portions per unit area of the second body part.

When the number of first main sub-pixel opening portions 424*a*-1 or a sum of the areas of the first main sub-pixel opening portions 424*a*-1 per unit area is greater than the number of first auxiliary sub-pixel opening portions or a sum of the areas of the first auxiliary sub-pixel opening portions, the first mask sheet may not be uniformly deformed or may be distorted due to the second body part when the first mask sheet is elongated.

In order to solve the problems, the first correction opening portions 424*c*-1 may be formed in the third body part 422*c*-1 to be the same as the second body part or a sum of the areas of the first auxiliary sub-pixel opening portions.

In the above case, shapes and sizes of the first correction opening portions 424*c*-1 may be the same as those of the first main sub-pixel opening portions 424*a*-1. However, the number of first correction opening portions 424*c*-1 or a sum of the areas of the first correction opening portions 424*c*-1 per unit area may be less than the number of first main sub-pixel opening portions 424*a*-1 or a sum of the areas of the first main sub-pixel opening portions 424*a*-1 as described above.

When the first main sub-pixel opening portions 424*a*-1 and the first auxiliary sub-pixel opening portions have the same shape and different sizes, the third body part 422*c*-1 and the second body part may be formed in the same manner or different manners.

For example, when the third body part 422c-1 is the same as the second body part, the third body part 422c-1 may include the first correction opening portions 424c-1 having the same shape, the same size, and the same number as the first auxiliary sub-pixel opening portions. In this case, the first auxiliary sub-pixel opening portions and the first correction opening portions 424c-1 may be located to correspond to each other. In contrast, when the third body part 422c-1 and the second body part are different from each other, the third body part 422c-1 may be formed to have many various shapes as described with reference to FIGS. 12A, and 15 through 17.

In the above case, even when the second body part and the first body part 422a-1 are formed differently, because the third body part 422c-1 is provided, the first mask sheet may be uniformly deformed.

Accordingly, because the mask sheet used to form sub-pixels having a shape different from that of a first display area in a second display area is expectably or uniformly deformed, a display apparatus having a precise pattern may be manufactured.

Although not illustrated in FIG. 24, the above description may also apply to a second mask sheet (not illustrated) and a third mask sheet (not illustrated).

An apparatus and method of manufacturing a display apparatus according to the one or more embodiments of the inventive concepts may manufacture a display apparatus having a precise pattern.

The apparatus and method of manufacturing a display apparatus according to the one or more embodiments of the inventive concepts may minimize deformation of a mask sheet.

The apparatus and method of manufacturing a display apparatus according to the one or more embodiments of the inventive concepts may manufacture a display apparatus having display areas having different transmittances.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:

locating a display substrate and a mask assembly inside a chamber; and depositing a deposition material on the display substrate through the mask assembly, wherein the mask assembly comprises:

a mask frame having an opening portion; and a mask sheet on the mask frame, wherein:

the mask sheet comprises:

a first body part having a plurality of first opening portions arranged in a continuous array;

a second body part having a plurality of second opening portions surrounded by the continuous array of first opening portions; and a third body part having a third opening portion surrounded by the continuous array of first opening portions and offset from the second body part;

at least one of a shape of the second opening portion, a size of the second opening portion, and a distance between adjacent ones of the second opening portions is different from that of the first opening portions;

a plurality of second body parts and a plurality of third body parts are provided;

the plurality of second body parts are aligned with one another, and the plurality of third body parts are aligned with one another;

the plurality of second body parts and the plurality of third body parts are alternately arranged in a zigzag shape or a serpentine shape along a longitudinal direction of the mask sheet; and wherein each of the plurality of second body parts and each of the plurality of third body parts are provided so as to not overlap each other along the longitudinal direction of the mask sheet.

2. The method of claim 1, wherein a shape of the second opening portion and a shape of the third opening portion are same.

3. The method of claim 1, wherein the mask assembly further comprises a support frame located in a direction different from a longitudinal direction of the mask sheet and supporting the mask sheet, wherein the third body part overlaps the support frame in a plan view, and wherein the second body part does not overlap the support frame in the plan view.

4. The method of claim 1, wherein the second body part and the third body part are located opposite to each other with respect to an arbitrary straight line parallel to a longitudinal direction of the mask sheet and passing through a center of the mask sheet.

5. The method of claim 1, wherein a distance from an edge of the second opening portion located at an outermost portion of the second body part to an edge of the mask sheet is same as a distance from an edge of the third opening portion located at an outermost portion of the third body part to an edge of the mask sheet.

6. The method of claim 1, wherein each of the third body part has a plurality of the third opening portions, and wherein a sum of areas of the second opening portions of the plurality of second body parts and a sum of areas of the third opening portions of the plurality of third body parts are same.

7. The method of claim 1, wherein at least some of the plurality of third body parts are arranged symmetric to each other with respect to an arbitrary straight line perpendicular to a longitudinal direction of the mask sheet and passing through a center of the mask sheet.

8. The method of claim 1, wherein the mask assembly further comprises a support frame located in a direction different from a longitudinal direction of the mask sheet and supporting the mask sheet, wherein a plurality of support frames are provided, wherein a passage area through which the deposition material passes is defined by adjacent support frames from among the plurality of support frames and an edge of the first body part, or by one of the plurality of support frames, the mask frame, and an edge of the first body part, and wherein each of the second body parts is located at a corner portion of the passage area.

9. A method of manufacturing a display apparatus, the method comprising:

locating a display substrate and a mask assembly inside a chamber; and depositing a deposition material on the display substrate through the mask assembly, wherein:

the mask assembly comprises:

a mask frame having an opening portion;

a support frame located at the opening portion; and a mask sheet on the mask frame;

the mask sheet comprises:

a first body part having a plurality of a first opening portions arranged in a continuous array;

a second body part having a plurality of second opening portions surrounded by the continuous array of first opening portions; and a third body part having a third opening portion surrounded by the continuous array of first opening portions and offset from the second body part;

at least one of a shape of the second opening portion, a size of the second opening portion, and a distance between adjacent ones of the second opening portions is different from that of the first opening portions;

the support frame is disposed to overlap the third body part and some of the plurality of the first opening portions and is spaced apart from the second body part; and wherein each of the second body part and the third body part is arranged in a line along the length direction of the mask sheet, and the second body part and the third body part are provided so as to not overlap each other along the longitudinal direction of the mask sheet.

10. A method of manufacturing a display apparatus, the method comprising:

locating a display substrate and a mask assembly inside a chamber; and depositing a deposition material on the display substrate through the mask assembly, wherein:

the mask assembly comprises:

a mask frame having an opening portion; and a mask sheet on the mask frame;

the mask sheet comprises:

a first body part having a plurality of first opening portions arranged in a continuous array;

a second body part having a plurality of second opening portions surrounded by the continuous array of first opening portions; and a third body part having a third opening portion surrounded by the continuous array of first opening portions and offset from the second body part;

at least one of a shape of the second opening portion, a size of the second opening portion, and a distance between adjacent ones of the second opening portions is different from that of the first opening portions;

a shape of the second body part is same as a shape of the third body part in a plan view;

wherein a plurality of second body parts and a plurality of third body parts are provided;

the plurality of second body parts are aligned with one another, and the plurality of third body parts are aligned with one another;

the plurality of second body parts and the plurality of third body parts are alternately arranged in a zigzag shape or a serpentine shape along a longitudinal direction of the mask sheet; and wherein each of the plurality of second body parts and each of the plurality of third body parts are provided so as to not overlap each other along the longitudinal direction of the mask sheet.

11. The method of claim 1, wherein the second body parts and the third body parts are located opposite to each other with respect to an arbitrary straight line parallel to a longitudinal direction of the mask sheet and passing through a center of the mask sheet, and wherein the second body parts and the third body parts do not overlap each other in a direction perpendicular to the longitudinal direction of the mask sheet.

12. The method of claim 1, wherein the plurality of second body parts are aligned with one another, and the plurality of third body parts are aligned with one another.

13. The method of claim 12, wherein each of the second body parts and each of the third body parts are arranged in the serpentine shape.

* * * * *